United States Patent
Rabkin et al.

(10) Patent No.: US 11,476,272 B2
(45) Date of Patent: Oct. 18, 2022

(54) THREE-DIMENSIONAL MEMORY DEVICE WITH A GRAPHENE CHANNEL AND METHODS OF MAKING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 771 days.

(21) Appl. No.: 16/227,374

(22) Filed: Dec. 20, 2018

(65) Prior Publication Data
US 2020/0203362 A1 Jun. 25, 2020

(51) Int. Cl.
| | |
|---|---|
| *H01L 27/11582* | (2017.01) |
| *H01L 27/11565* | (2017.01) |
| *H01L 27/1157* | (2017.01) |
| *H01L 27/11573* | (2017.01) |
| *H01L 27/11529* | (2017.01) |

(Continued)

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11558* (2013.01); *H01L 27/11565* (2013.01);
(Continued)

(58) Field of Classification Search
CPC ........... H01L 27/11582; H01L 29/7926; H01L 27/11556; H01L 29/1606; H01L 21/0405–042; H01L 21/02376; H01L 29/66015–66022; H01L 29/66045
See application file for complete search history.

(56) References Cited

U.S. PATENT DOCUMENTS

| | | |
|---|---|---|
| 8,772,853 B2 | 7/2014 | Hong et al. |
| 9,425,299 B1 | 8/2016 | Rabkin et al. |

(Continued)

OTHER PUBLICATIONS

U.S. Appl. No. 16/227,889, filed Dec. 20, 2018, Sandisk Technologies LLC.

(Continued)

*Primary Examiner* — Amar Movva
(74) *Attorney, Agent, or Firm* — The Marbury Law Group PLLC

(57) ABSTRACT

Memory stack structures extending through an alternating stack of insulating layers and electrically conductive layers is formed over a substrate. Each memory stack structure includes a memory film and a vertical semiconductor channel. A sacrificial polycrystalline metal layer may be formed on each memory film, and a carbon precursor may be decomposed on a physically exposed surface of the sacrificial polycrystalline metal layer to generate adsorbed carbon atoms. A subset of the adsorbed carbon atoms diffuses through grain boundaries in the polycrystalline e metal layer to an interface with the memory film. The carbon atoms at the interface may be coalesced into at least one graphene layer by an anneal process. The at least one graphene layer functions as a vertical semiconductor channel, which provides a higher mobility than silicon. A metallic drain region may be formed at an upper end of each vertical semiconductor channel.

20 Claims, 27 Drawing Sheets

(51) Int. Cl.
*H01L 27/11556* (2017.01)
*H01L 27/11524* (2017.01)
*H01L 27/11558* (2017.01)
*H01L 27/11519* (2017.01)
*H01L 29/792* (2006.01)
*H01L 29/16* (2006.01)

(52) U.S. Cl.
CPC .... *H01L 27/11573* (2013.01); *H01L 29/1606* (2013.01); *H01L 29/7926* (2013.01)

(56) References Cited

U.S. PATENT DOCUMENTS

| | | | |
|---|---|---|---|
| 9,449,980 B2 | 9/2016 | Rabkin | |
| 9,721,963 B1 | 8/2017 | Rabkin et al. | |
| 9,780,108 B2 | 10/2017 | Rabkin et al. | |
| 9,941,295 B2 | 4/2018 | Rabkin et al. | |
| 2004/0067653 A1* | 4/2004 | Peng | H01L 27/1052 257/E21.507 |
| 2010/0320520 A1* | 12/2010 | Nakagawa | H01L 21/02178 257/532 |
| 2013/0015429 A1* | 1/2013 | Hong | G11C 16/04 257/29 |
| 2016/0141373 A1* | 5/2016 | Cantoro | H01L 27/0886 257/27 |
| 2017/0110464 A1* | 4/2017 | Rabkin | H01L 27/11582 |

OTHER PUBLICATIONS

Sung et al., "Band Gap Engineering for Graphene by Using Na+ Ions," Applied Physics Letters 105, 081605 (2014).

D. Sharma, "Chemical Vapor Deposition of Graphene on a Dielectric Substrate and its Characterization," University of Eastern Finland, Department of Physics and Mathematics, May 2012.

Rani et al., "Designing Band Gap of Graphene by B and N Dopant Atoms," RSC Advances, Nov. 9, 2012.

Ismach et al., "Direct Chemical Vapor Deposition of Graphene on Dielectric Surfaces," Nano Letters, 10, 1542 (2010).

Wang et al., "Free-standing Subnanometer Graphite Sheets," Appl. Phys. Lett. 85, 1265 (2004).

Reina et al., "Large Area, Few-Layer Graphene Films on Arbitrary Substrates by Chemical Vapor Deposition," Nano Letters, vol. 9, No. 1, 2009.

Endoh et al., "Novel Ultra High Density Memory with a Stacked-Surrounding Gate Transistor (S-SGT) Structured Cell," IEDM Proc. (2001) 33-36.

\* cited by examiner

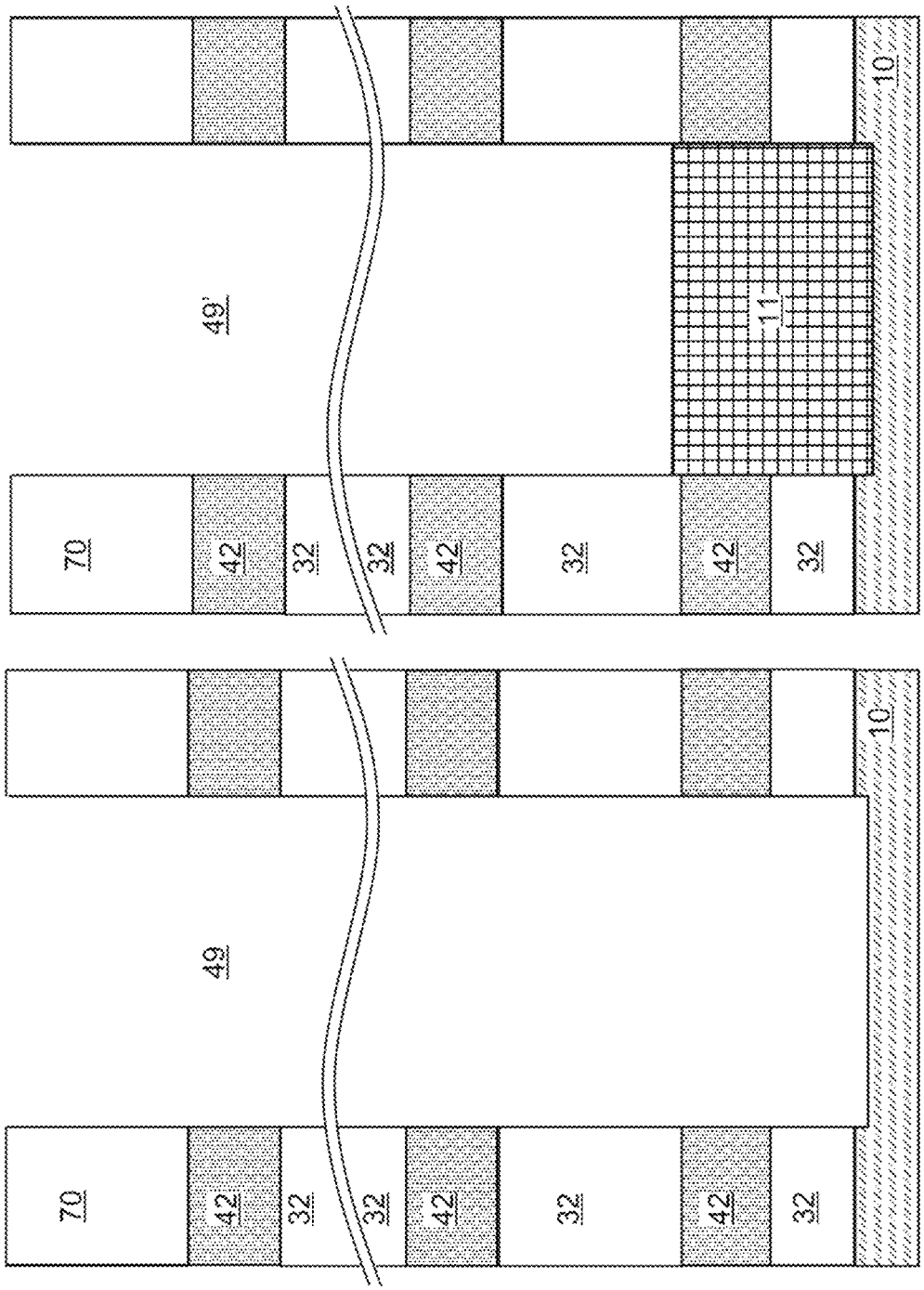

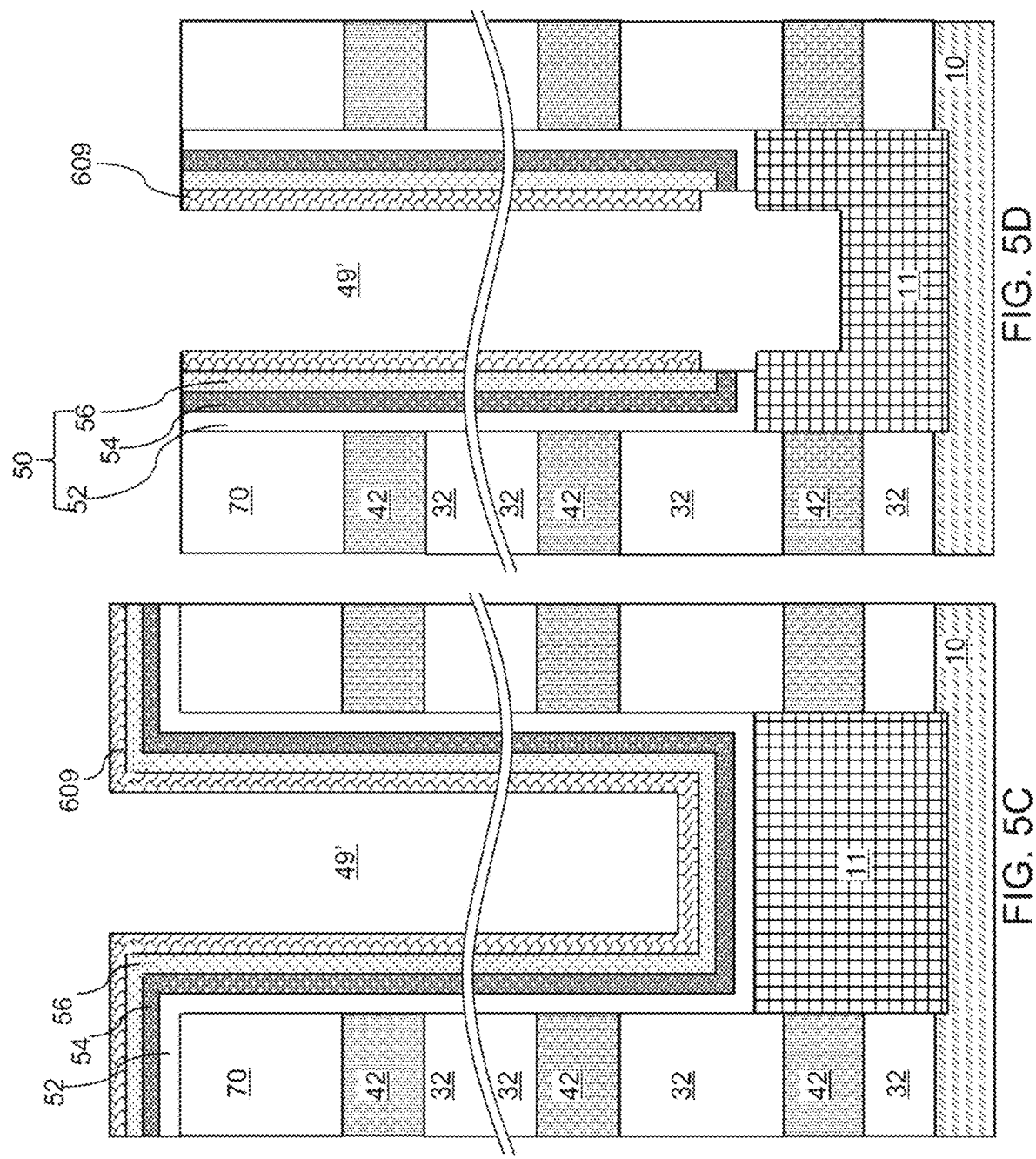

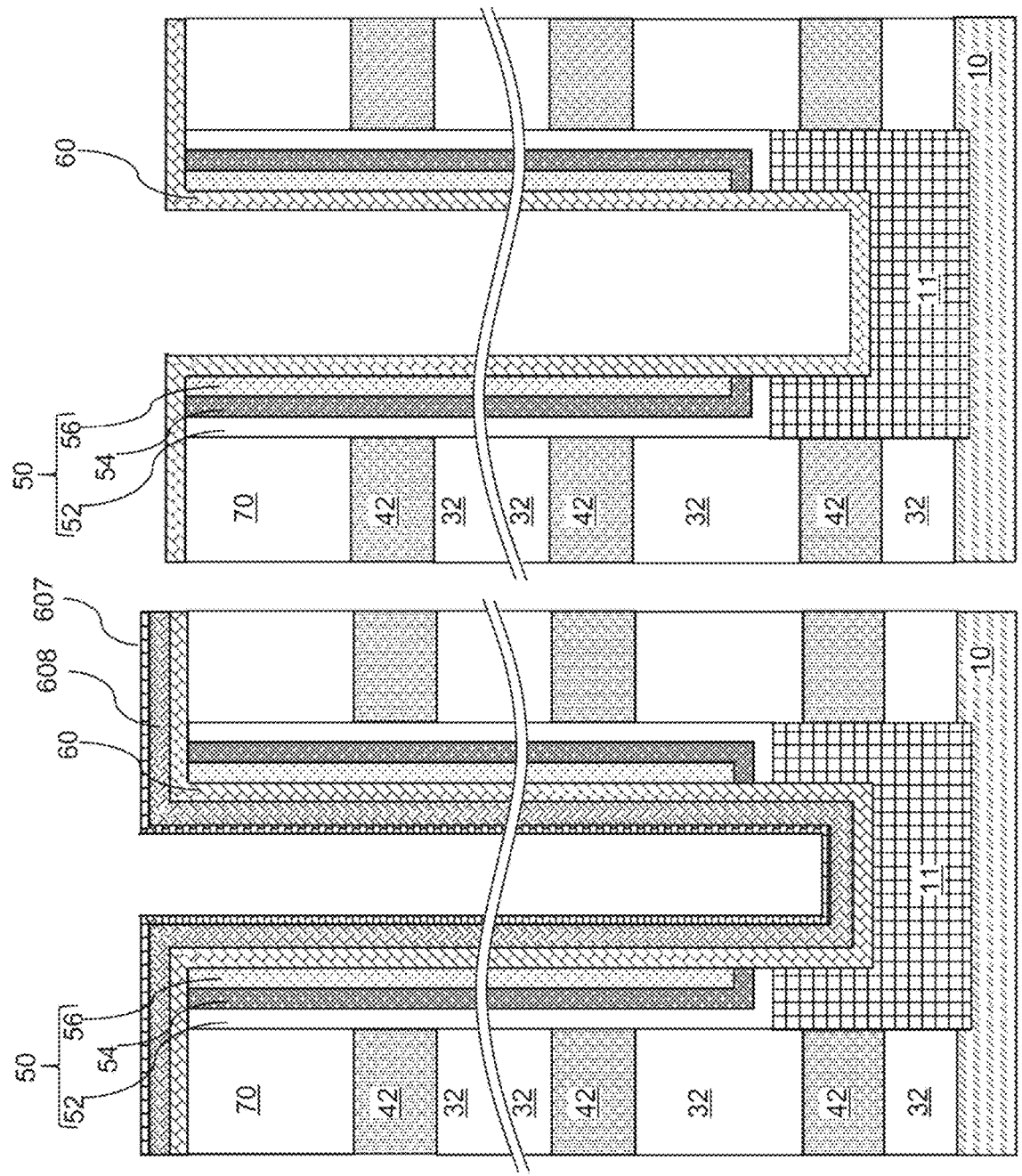

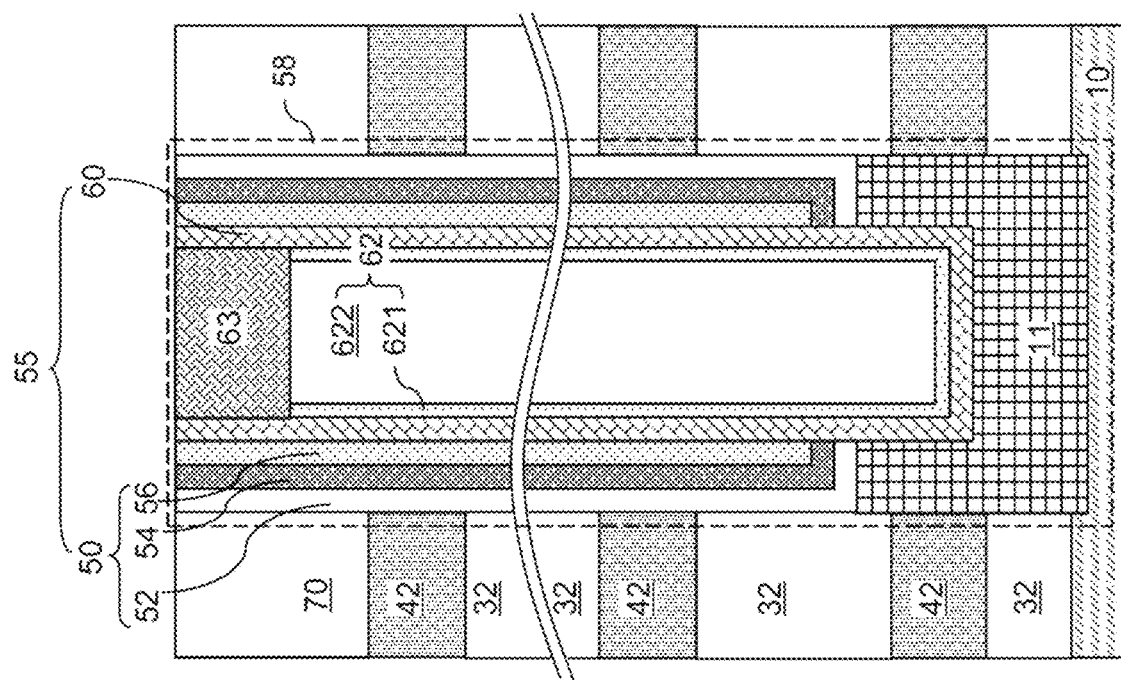

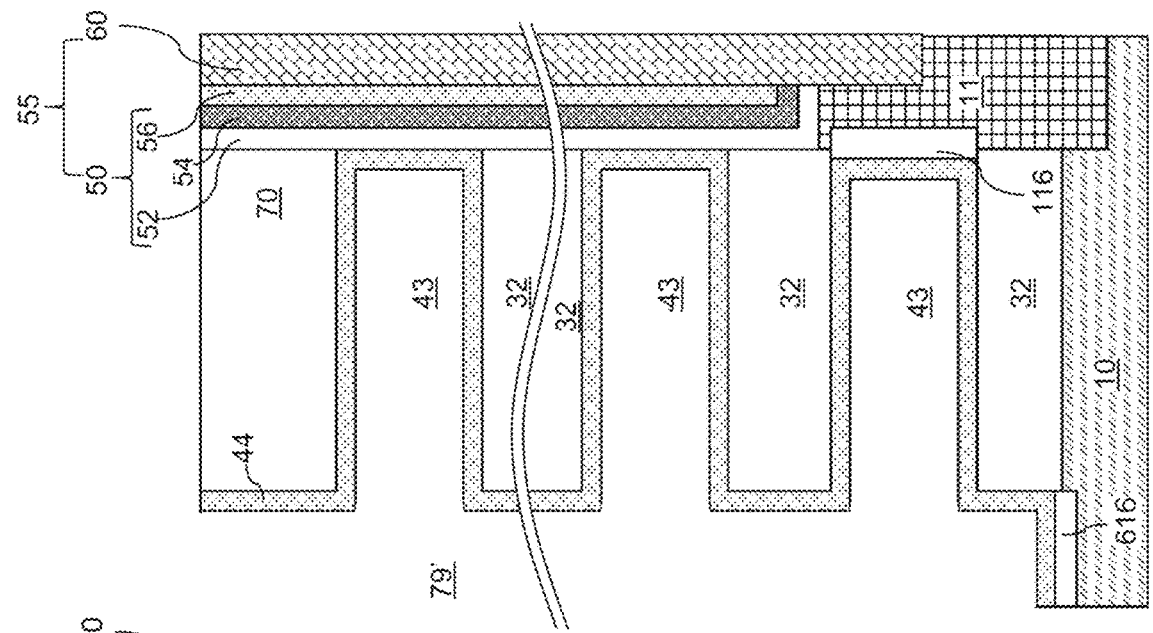
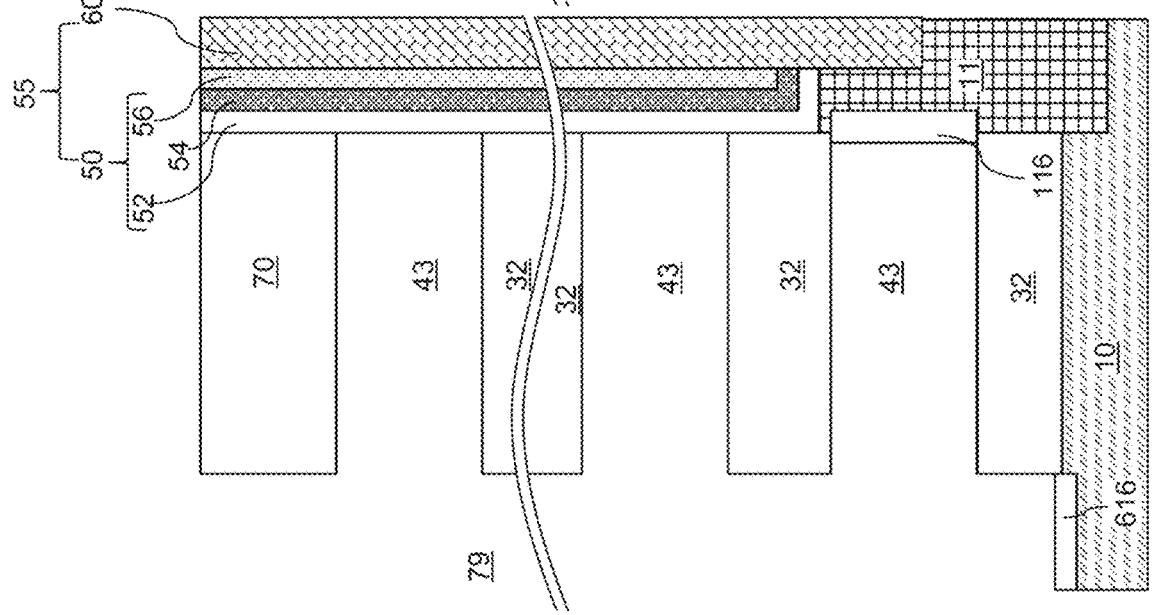

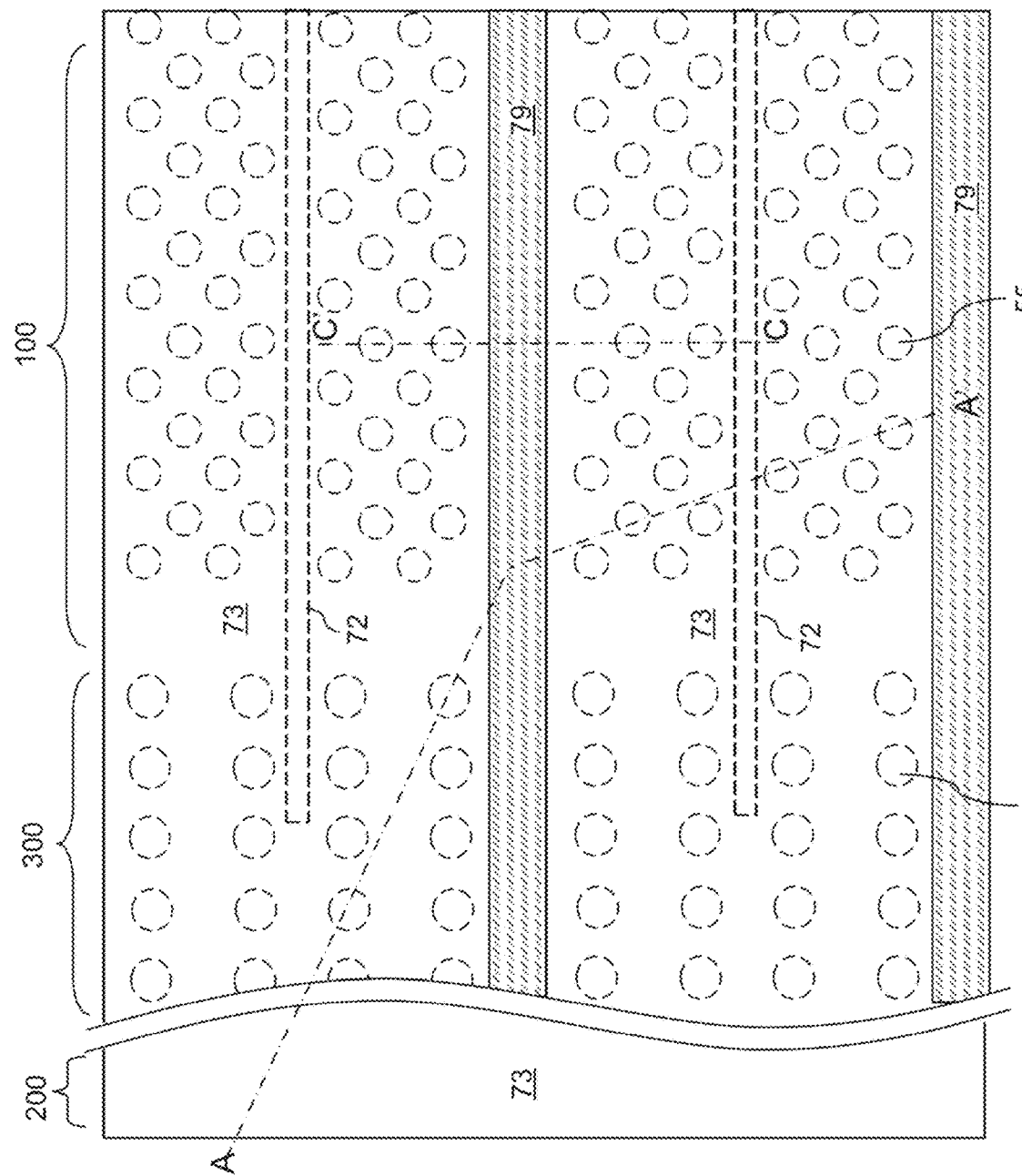

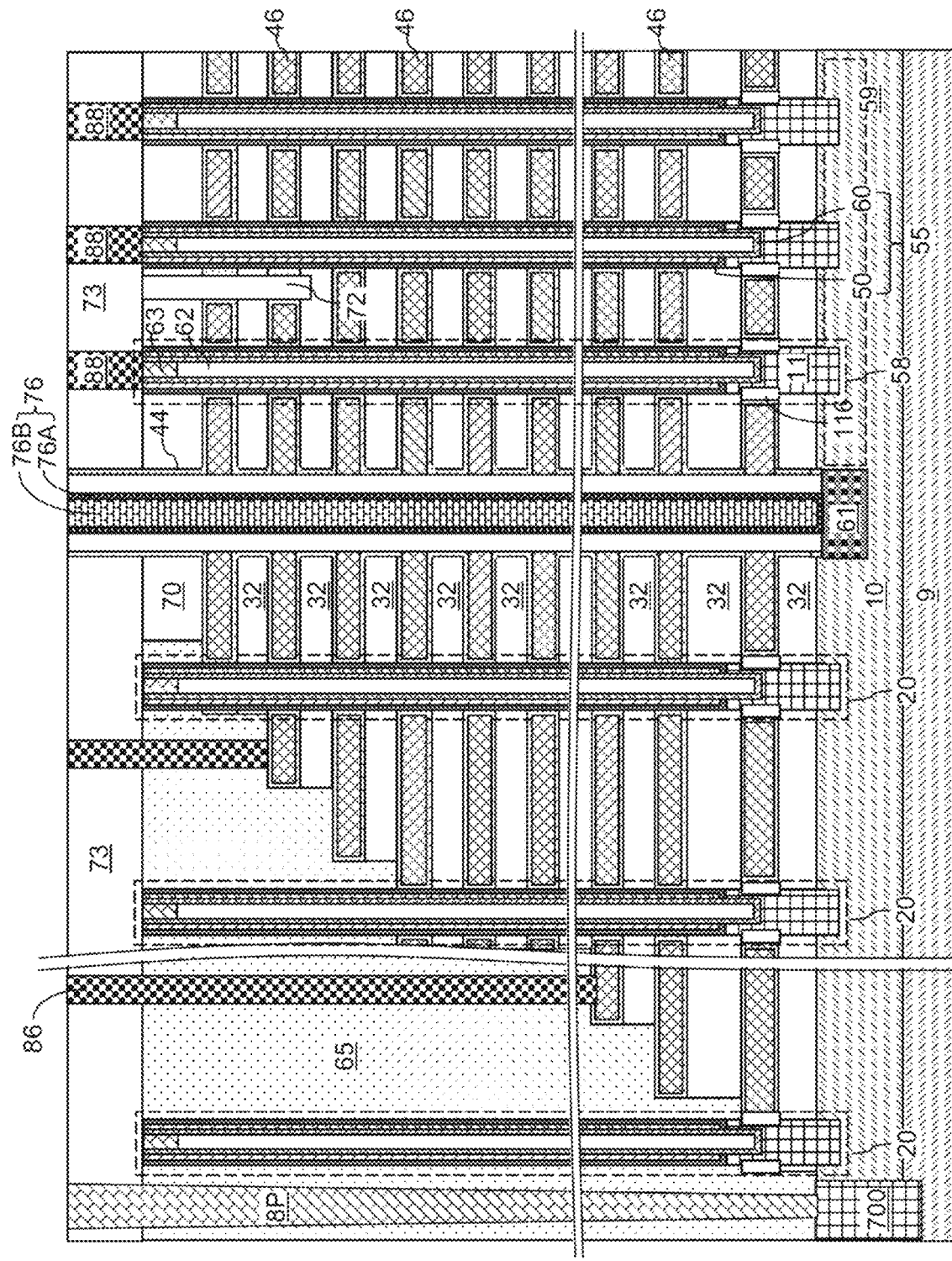

THREE-DIMENSIONAL MEMORY DEVICE WITH A GRAPHENE CHANNEL AND METHODS OF MAKING THE SAME

FIELD

The present disclosure relates generally to the field of semiconductor devices, and particular to a three-dimensional memory device including a graphene channel and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. The length of vertical semiconductor channels increases as the number of stacked word lines increases, and the on-current of vertical semiconductor channels proportionally decreases. Vertical semiconductor channels providing a higher charge carrier mobility is desired in order to provide continued scaling of three-dimensional NAND memory devices.

SUMMARY

According to an embodiment of the present disclosure, a three-dimensional memory device is provided, which comprises: an alternating stack of insulating layers and electrically conductive layers located over a substrate; and a memory stack structure extending through the alternating stack and comprising a memory film and a vertical semiconductor channel, wherein the vertical semiconductor channel contacts an inner sidewall of the memory film and comprises at least one graphene layer.

According to another embodiment of the present disclosure, a method of forming a three-dimensional memory device is provided, which comprises: forming an alternating stack of insulating layers and spacer material layers over a substrate, wherein the spacer material layers are formed as, or are replaced with, electrically conductive layers; and forming a memory stack structure comprising a memory film and a vertical semiconductor channel through the alternating stack, wherein the vertical semiconductor channel comprises at least one graphene layer formed directly on an inner sidewall of the memory film.

BRIEF DESCRIPTION OF THE DRAWINGS

FIGS. 5A-5E are sequential schematic vertical cross-sectional views of a memory opening within the exemplary structure during formation of a memory film according to an embodiment of the present disclosure.

FIGS. 5G-5K are sequential schematic vertical cross-sectional views of a memory opening within the exemplary structure during formation of a memory stack structure after the processing steps of FIG. 5F according to an embodiment of the present disclosure.

FIGS. 9A-9D are sequential vertical cross-sectional views of a region of the exemplary structure during formation of electrically conductive layers according to an embodiment of the present disclosure.

FIG. 11B is a partial see-through top-down view of the exemplary structure of FIG. 11A. The vertical plane A-A' is the plane of the schematic vertical cross-sectional view of FIG. 11A.

FIG. 13A is a schematic vertical cross-sectional view of the exemplary structure after formation of additional contact via structures according to an embodiment of the present disclosure.

DETAILED DESCRIPTION

Figure 1:
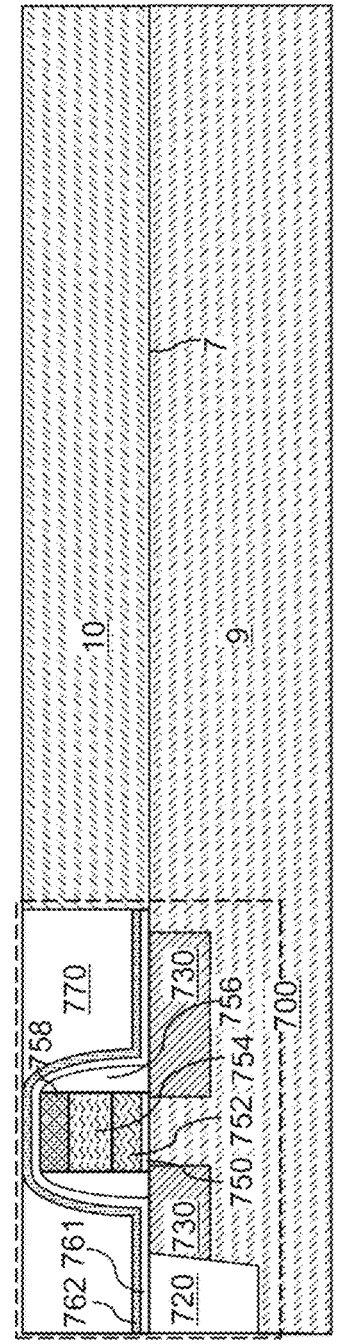
FIG. 1 is a schematic vertical cross-sectional view of an exemplary structure after formation of at least one peripheral device, and a semiconductor material layer according to an embodiment of the present disclosure.

As discussed above, the present disclosure is directed to a three-dimensional memory device including a graphene channel and methods of manufacturing the same, the various aspects of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device.

For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which may be a substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and metallic drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers may be provided between the memory array region 100 and the peripheral device region 200.

Figure 2:
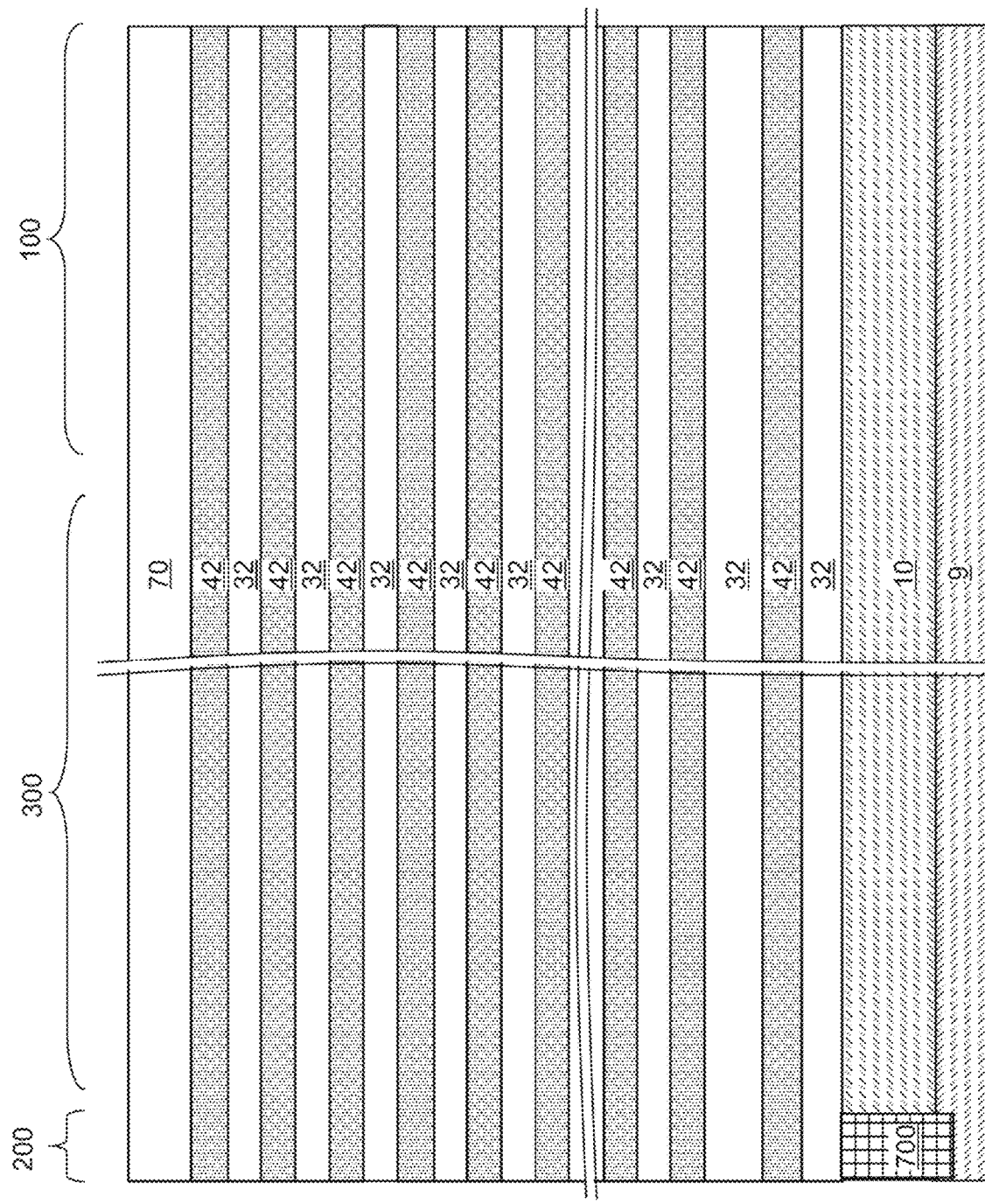
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate (9, 10).

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
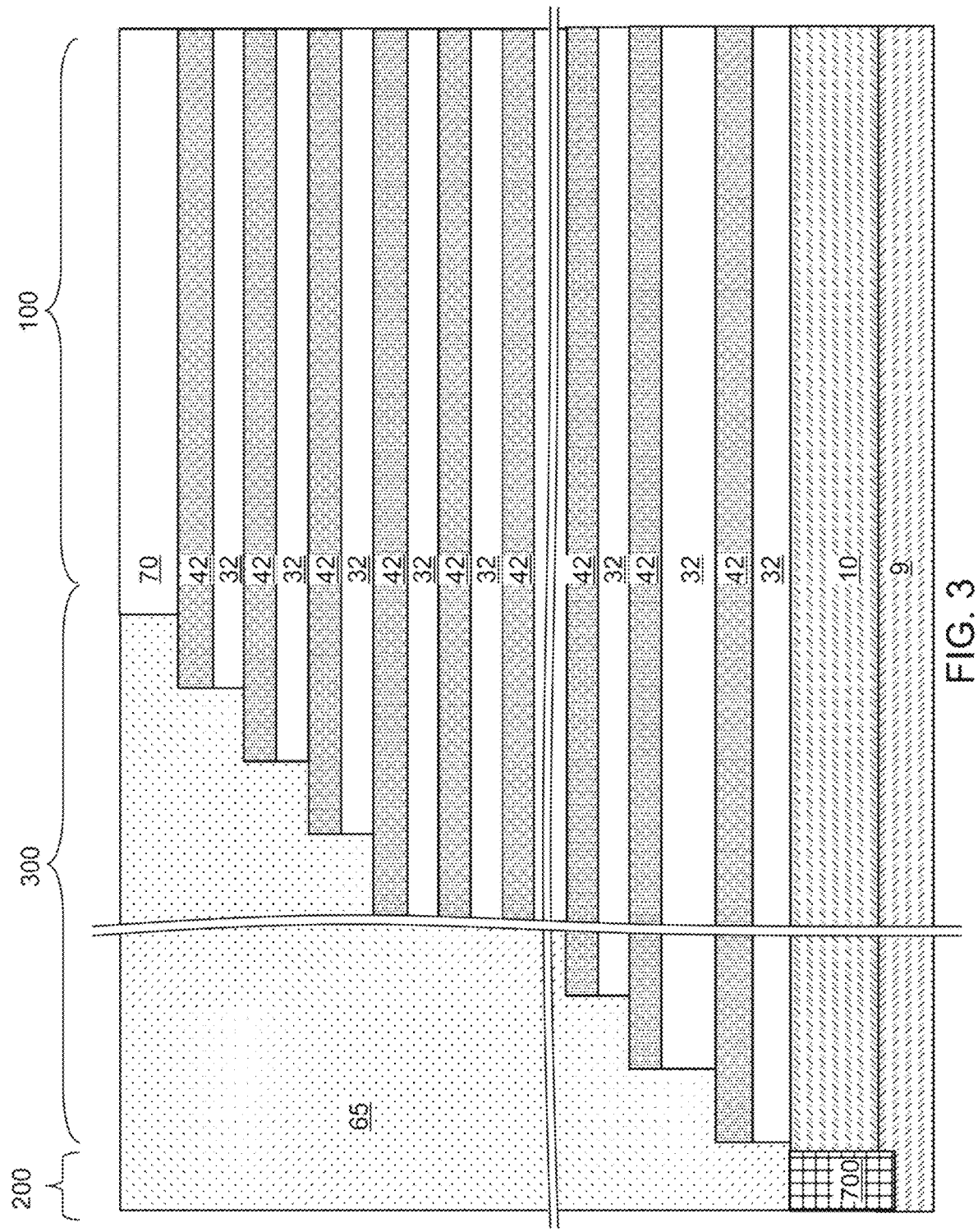
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
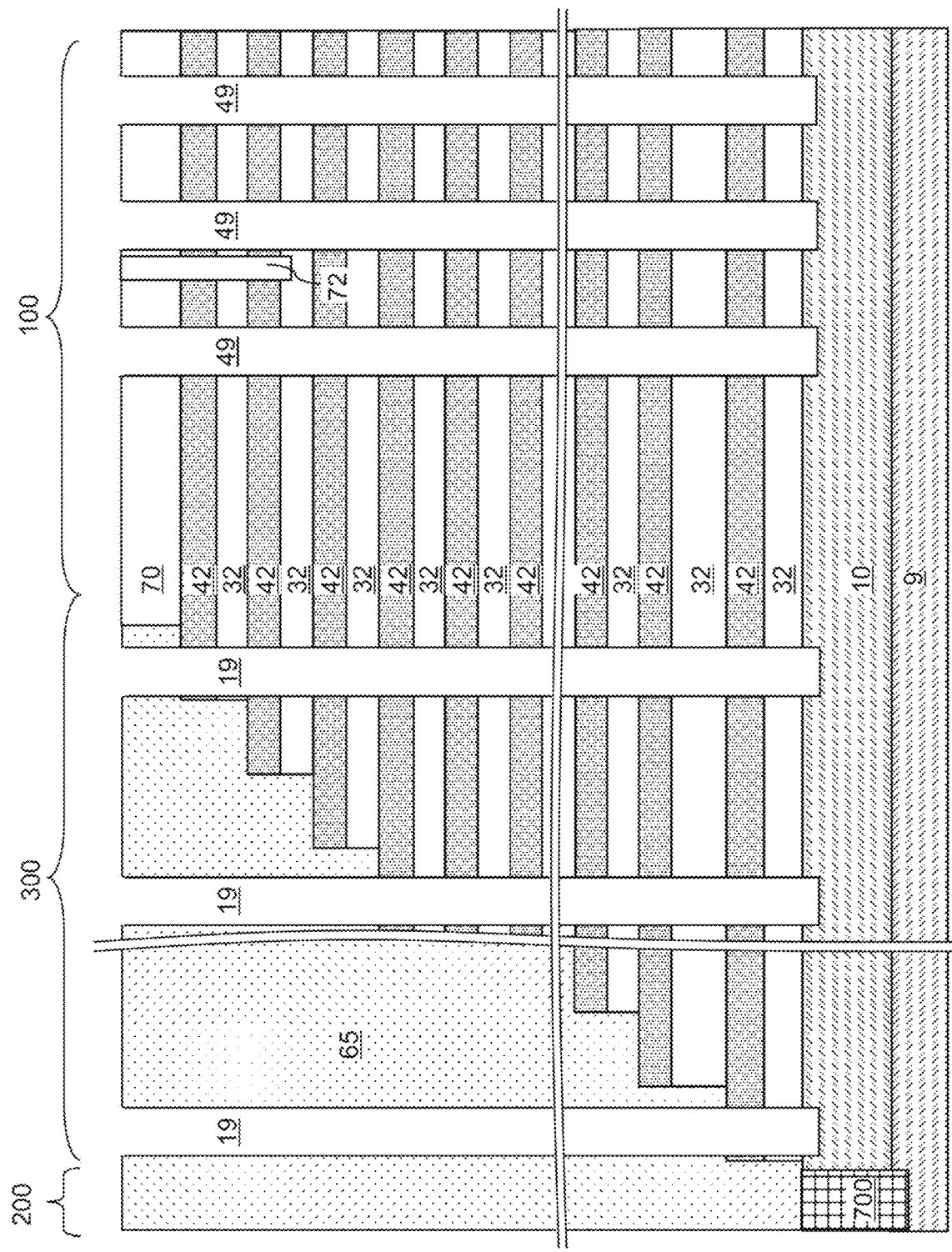
FIG. 4A is a schematic vertical cross-sectional view of the exemplary structure after formation of memory openings and support openings according to an embodiment of the present disclosure.
Figure 4B:
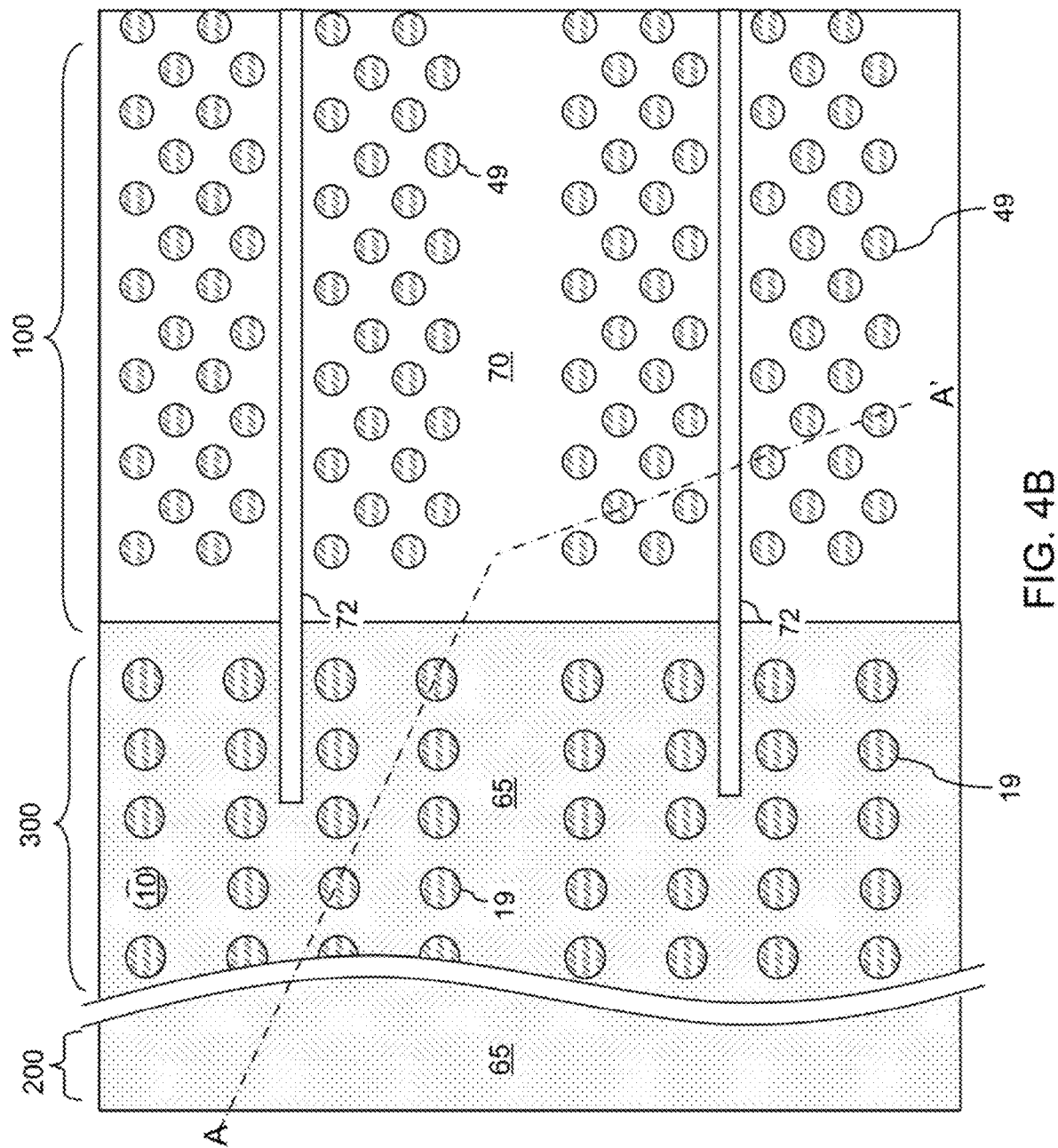
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the contact region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls)

that extends substantially perpendicular to the topmost surface of the substrate (9, 10). A two-dimensional array of memory openings 49 may be formed in the memory array region 100. A two-dimensional array of support openings 19 may be formed in the contact region 300. The substrate semiconductor layer 9 and the semiconductor material layer 10 collectively constitutes a substrate (9, 10), which may be a substrate. Alternatively, the semiconductor material layer 10 may be omitted, and the memory openings 49 and the support openings 19 may be extend to a top surface of the substrate semiconductor layer 9.

FIGS. 5A-5K illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the substrate (9, 10) and a metallic drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 5C, a stack of layers including a blocking dielectric layer 52, a charge storage layer 54, a tunneling dielectric layer 56, and an optional sacrificial cover layer 609 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The sacrificial cover layer 609 includes a sacrificial material that protects the material of the tunneling dielectric layer 56 during a subsequent anisotropic etch process that removes horizontal portions of the sacrificial cover layer 609, the tunneling dielectric layer 56, the charge storage layer 54, and the blocking dielectric layer 52. The sacrificial cover layer 609 may include an amorphous semiconductor material (such as amorphous silicon) or amorphous carbon. The sacrificial cover layer 609 may be deposited by a conformal deposition process such as low pressure chemical vapor deposition or atomic layer deposition, and may have a thickness in a range from 2 nm to 10 nm, although lesser and greater thicknesses may also be used.

Referring to FIG. 5D, the optional sacrificial cover layer 609, the tunneling dielectric layer 56, the charge storage layer 54, the blocking dielectric layer 52 are sequentially anisotropically etched using at least one anisotropic etch process. The portions of the sacrificial cover layer 609, the tunneling dielectric layer 56, the charge storage layer 54, and the blocking dielectric layer 52 located above the top surface of the insulating cap layer 70 may be removed by the at least one anisotropic etch process. Further, the horizontal portions of the sacrificial cover layer 609, the tunneling dielectric layer 56, the charge storage layer 54, and the blocking dielectric layer 52 at a bottom of each memory cavity 49' may be removed to form openings in remaining portions thereof. Each of the sacrificial cover layer 609, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the sacrificial cover layer 609 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

In one embodiment, physically exposed portions of the tunneling dielectric layer 56, the charge storage layer 54, and the blocking dielectric layer 52 may be laterally recessed underneath a bottom portion of the sacrificial cover layer 609. A combination of wet etch processes may be used to laterally recess each of the tunneling dielectric layer 56, the charge storage layer 54, and the blocking dielectric layer 52 such that recessed cylindrical surfaces of the tunneling dielectric layer 56, the charge storage layer 54, and the blocking dielectric layer 52 are approximately vertically coincident with an overlying inner sidewall of the tunneling dielectric layer 56.

A surface of the pedestal channel portion 11 (or a surface of the semiconductor material layer 10 in case the pedestal channel portions 11 are not used) may be physically exposed underneath the opening through the sacrificial cover layer 609, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56.

Figure 5E:
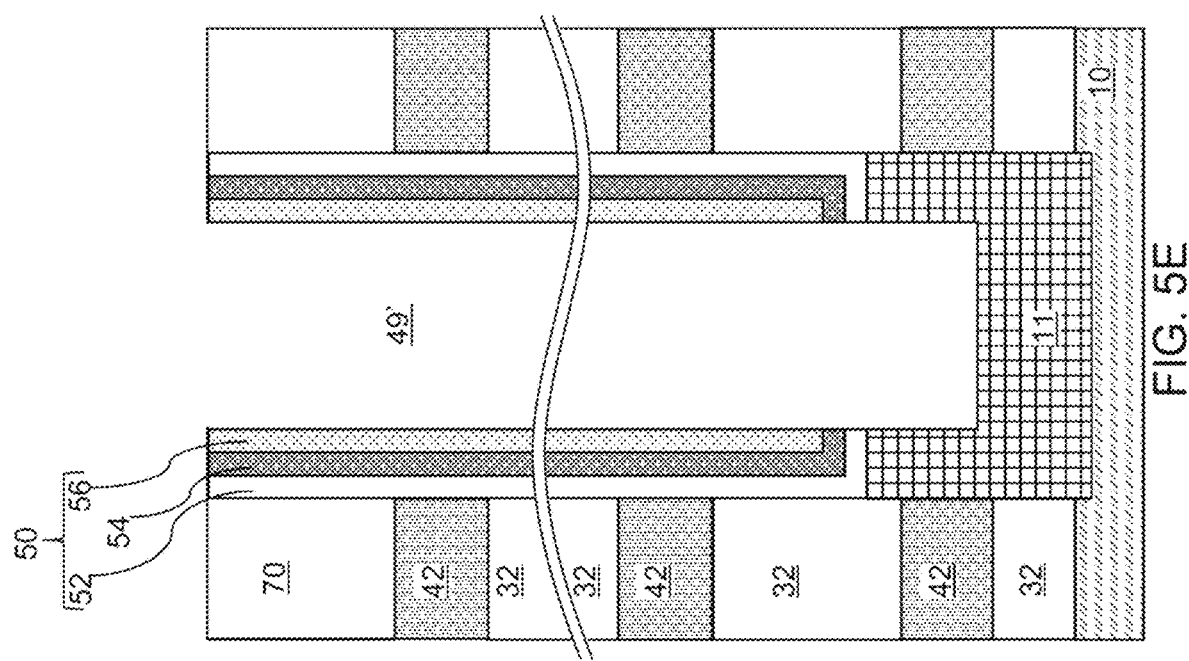

Referring to FIG. 5E, the sacrificial cover layer 609 may be removed selective to the tunneling dielectric layer 56. For example, if the sacrificial cover layer 609 includes amorphous silicon, a wet etch process using hot trimethyl-2 hydroxyethyl ammonium hydroxide ("hot TMY") or tetramethyl ammonium hydroxide (TMAH) may be used to remove the sacrificial cover layer 609 selective to the tunneling dielectric layer 56. The pedestal channel portion 11 may be collaterally recessed during the wet etch process.

Figure 5F:
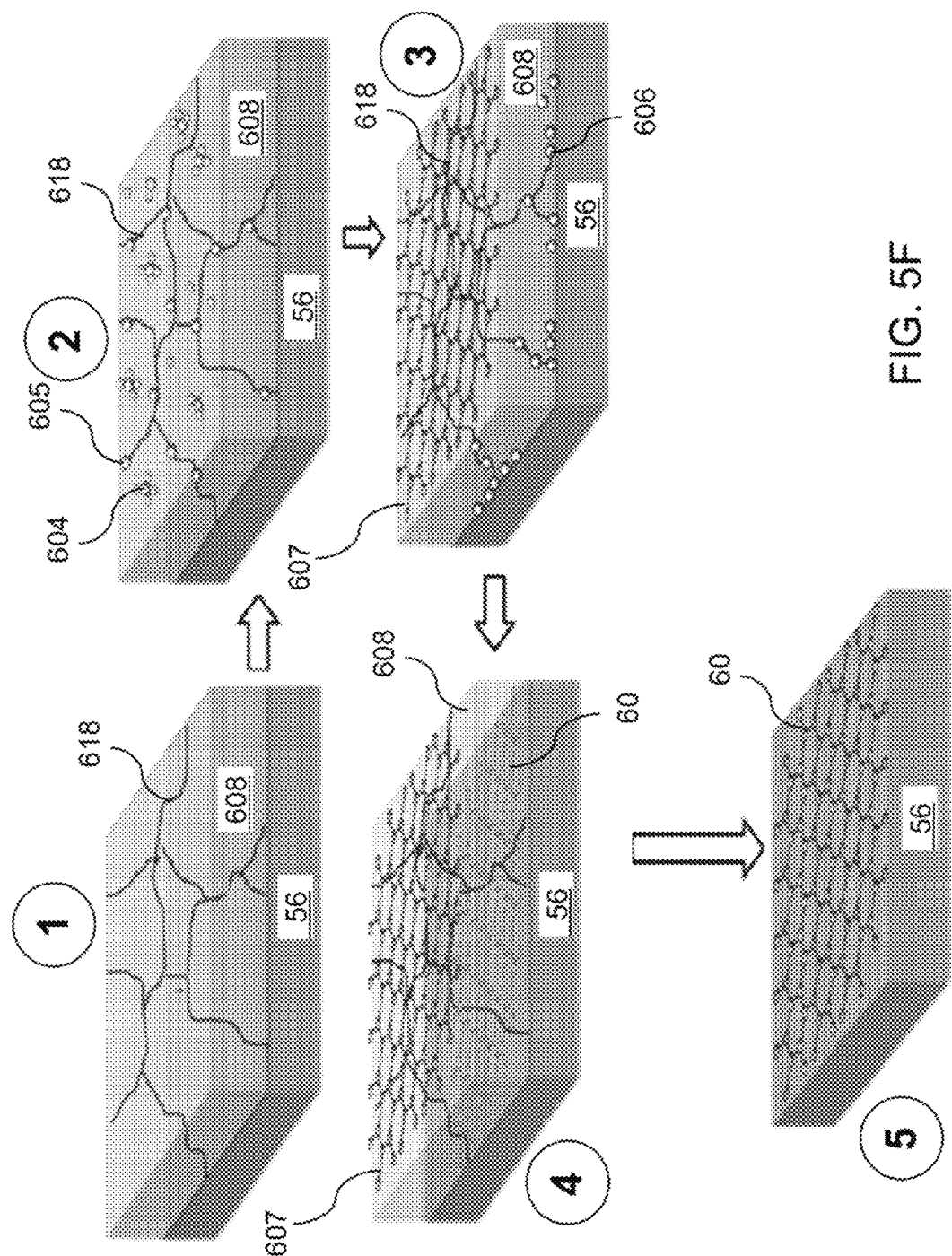
FIG. 5F illustrates processing steps for forming at least one graphene layer within each memory opening according to an embodiment of the present disclosure.

Referring to FIG. 5F, a region of a surface portion of the tunneling dielectric layer 56 is illustrated during various processing steps used for formation of a at least one graphene layer 60. The order of the processing steps is indicated by circled numbers.

At the processing step labeled "1," a polycrystalline metal layer 608 may be deposited directly on the memory film 50, and specifically, physically exposed surfaces of the tunneling dielectric layer 56 of memory film 50. The polycrystalline metal layer 608 may include an elemental metal that is formed with grain boundaries 618, and may be formed by metal-organic chemical vapor deposition (MOCVD). For example, the polycrystalline metal layer 608 may include a metal that may function as a catalyst for subsequent graphene film formation. In one embodiment, the polycrystalline metal layer 608 may include a metal selected from Cu, Ni, W, Mo, Zr, Ti, Hf, Nb, Ta, and Cr. The thickness of the polycrystalline metal layer 608 may be in a range from 1.5 nm to 10 nm, such as from 2 nm to 5 nm, although lesser and greater thicknesses may also be used. The average grain size within the plane of growth of the polycrystalline metal layer 608 may be in a range from 2 nm to 20 nm, such as from 3 nm to 10 nm, although lesser and average grain sizes may also be used.

The graphitization process may be subsequently performed in a graphene formation process chamber, which may be a chemical vapor deposition chamber provided with anneal capabilities. The graphene formation process chamber may be precleaned, for example, by filling up the anneal chamber with a purge gas (such as nitrogen gas) to a pressure of about 110 mbar pressure, and by subsequently pumping out the purge gas to provide a vacuum environment. In one embodiment, the purge and pump processes may be repeated multiple times first with nitrogen gas and then with hydrogen gas.

At the processing step labeled "2," the exemplary structure may be disposed in the graphene formation process chamber. The temperature of the graphene formation process chamber may be at a temperature of about 100 degrees Celsius under a hydrogen ambient having hydrogen partial pressure of about 5.3 mbar. The temperature ramp up rate may be about 10 degrees Celsius per minute. In case $CH_4$ is used as a carbon precursor gas in a subsequent chemical vapor deposition process, the temperature may be ramped up to about 700 degrees Celsius under the hydrogen ambient. At 700 degrees Celsius, hydrogen gas may be pumped out from the graphene formation process chamber and a chemical vapor deposition process may be performed. The chemical vapor deposition process provides carbon atoms on the surface of the polycrystalline metal layer 608. In an illustrative example, the flow rate for the hydrogen gas and the flow rate for $CH_4$ may be about the same, and the total pressure in the graphene formation process chamber may be about 7.8 mbar.

Alternative carbon precursor gases may be used with a suitable adjustment to the process temperature for the chemical vapor deposition process. Generally, the chemical vapor deposition process uses a carbon precursor gas, which may include, for example, any of $CH_4$, $C_2H_2$, $C_2H_4$, $C_2H_6$, $C_3H_4$, $C_3H_6$, $C_3H_8$, or combinations thereof. The process temperature may be in a range from 400 degrees Celsius to 1,000 degrees Celsius, and may be optimized for each species of the carbon precursor gas. The carbon precursor gas dissociates during the chemical vapor deposition process on the surface of the polycrystalline metal layer 608, and generates adsorbed carbon atoms 605 on a surface of the polycrystalline metal layer 608. A subset of the adsorbed carbon atoms 605 diffuse through the grain boundaries 618 in the polycrystalline metal layer 608 to the interface between the polycrystalline metal layer 608 and the tunneling dielectric layer 56. Generally, an adsorbed carbon precursor gas 604 may dissociate and generate adsorbed carbon atoms 605 on a surface of the polycrystalline metal layer 608 during the chemical vapor deposition process. A subset of the adsorbed carbon atoms 605 diffuses through the grain boundaries 618 in the polycrystalline metal layer 608 to the interface between the polycrystalline metal layer 608 and the tunneling dielectric layer 56 of memory film 50.

In one embodiment, at least one dopant species such as B, N, Na, or K may be provided to the interface between the polycrystalline metal layer 608 and the tunneling dielectric layer 56 to dope the at least one graphene layer to be subsequently formed. For example, at least one dopant gas may be flowed into the graphene formation process chamber during, or after, the chemical vapor deposition process to provide the at least one dopant species, which may diffuse through the polycrystalline metal layer 608. A gaseous compound of B, N, Na, or K may be flowed into the graphene formation process chamber during, or after, formation of the cluster of carbon atoms at the interface between the polycrystalline metal layer 608 and the tunneling dielectric layer 56.

At the processing step labeled "3," at least one top graphene layer 607 may be formed on the physically exposed top surface of the polycrystalline metal layer 608. At the same time, carbon atoms 606 diffuse through the grain boundaries 618 of the polycrystalline metal layer 608 into the interface between the memory film 50 (including tunneling dielectric layer 56) and the polycrystalline metal layer 608 as the chemical vapor deposition process continues. The carbon atoms 606 accumulate and coalesce at the interface between the memory film 50 and the polycrystalline metal layer 608, and separate the polycrystalline metal layer 608 from the memory film 50. The chemical vapor deposition process that provides adsorbed carbon atoms 605 may be terminated once a sufficient amount of carbon atoms 606 accumulates between the memory film 50 and the polycrystalline metal layer 608. The duration of the chemical vapor deposition process may be selected such that the total amount of carbon atoms 606 that accumulate between the memory film 50 and the polycrystalline metal layer 608 is sufficient to form at least one graphene layer. In one embodiment, the duration of the chemical vapor deposition process may be selected such that the total amount of carbon atoms 606 that accumulate between the memory film 50 and the polycrystalline metal layer 608 is in a range between the amount for forming a single graphene layer with complete coverage of the tunneling dielectric layer 56 of memory film 50 and the amount for forming six graphene layers with complete coverage of the tunneling dielectric layer 56.

At the processing step labeled "4," graphitization of carbon atoms trapped between the polycrystalline metal layer 608 and the tunneling dielectric layer 56 may be facilitated by performing a graphitization anneal process. At least one graphene layer 60 may be formed between the polycrystalline metal layer 608 and the tunneling dielectric layer 56. In an illustrative example, the temperature of the graphene formation process chamber may be elevated to an anneal temperature about 950 degrees Celsius. The anneal temperature may be maintained for a duration in a range from 1 minute to 20 minutes. Subsequently, the graphene formation process chamber may be cooled to a temperature of about 700 degrees Celsius in hydrogen ambient. Subsequent cooling of the graphene formation process chamber may occur concurrently with cyclical pumping and backfilling of the graphene formation process chamber with hydrogen. The maximum hydrogen backfill pressure may be, for example, in a range from 1 mbar to 100 mbar. The temperature ramp down rate may be about 10 degrees Celsius per minute. The coalesced carbon atoms bond during the temperature ramp up, at the anneal temperature, and/or the temperature ramp down to form the at least one graphene layer 60. Formation of the at least one graphene layer 60 occurs generally above the temperature of 700 degrees Celsius.

Figure 5I:
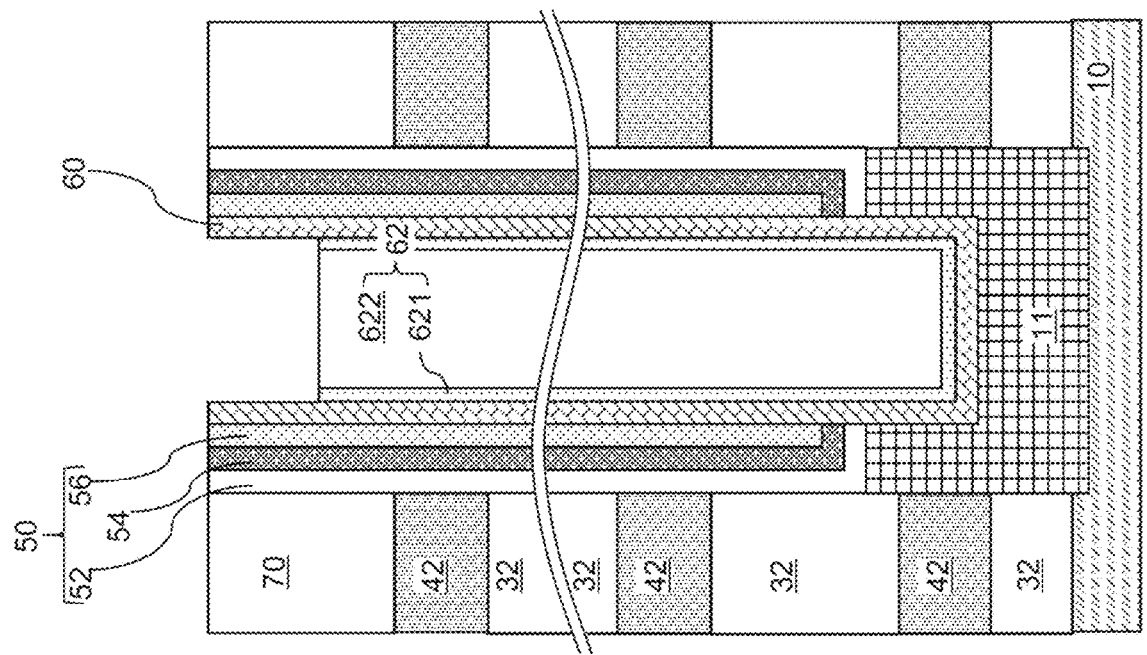
Figure 5J:
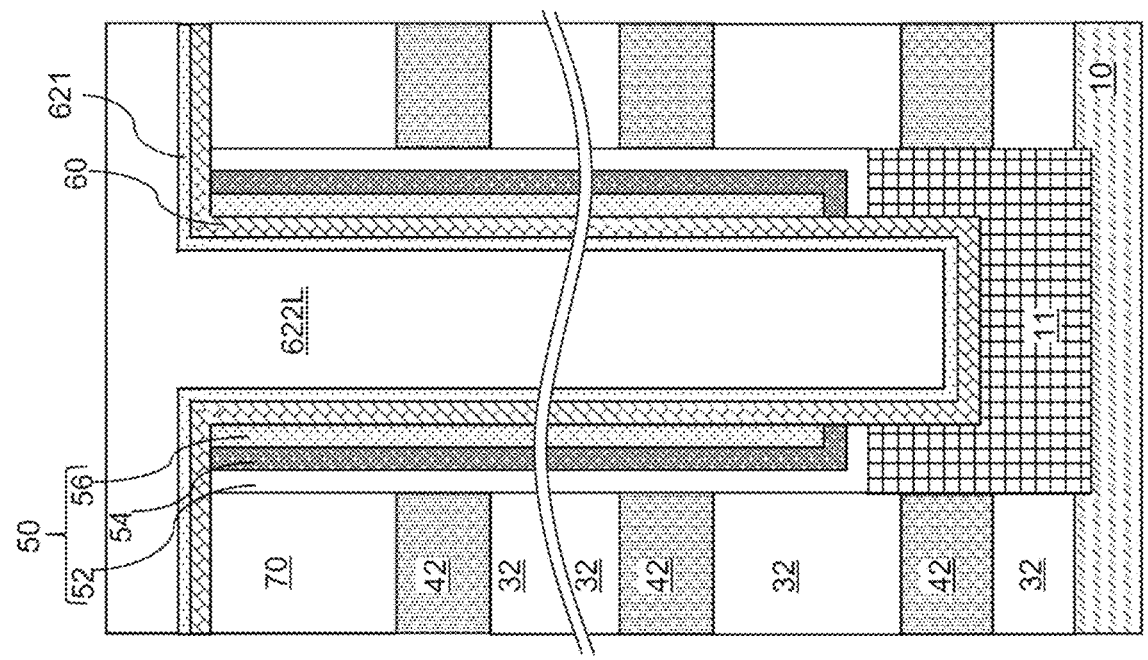
Figure 5L:
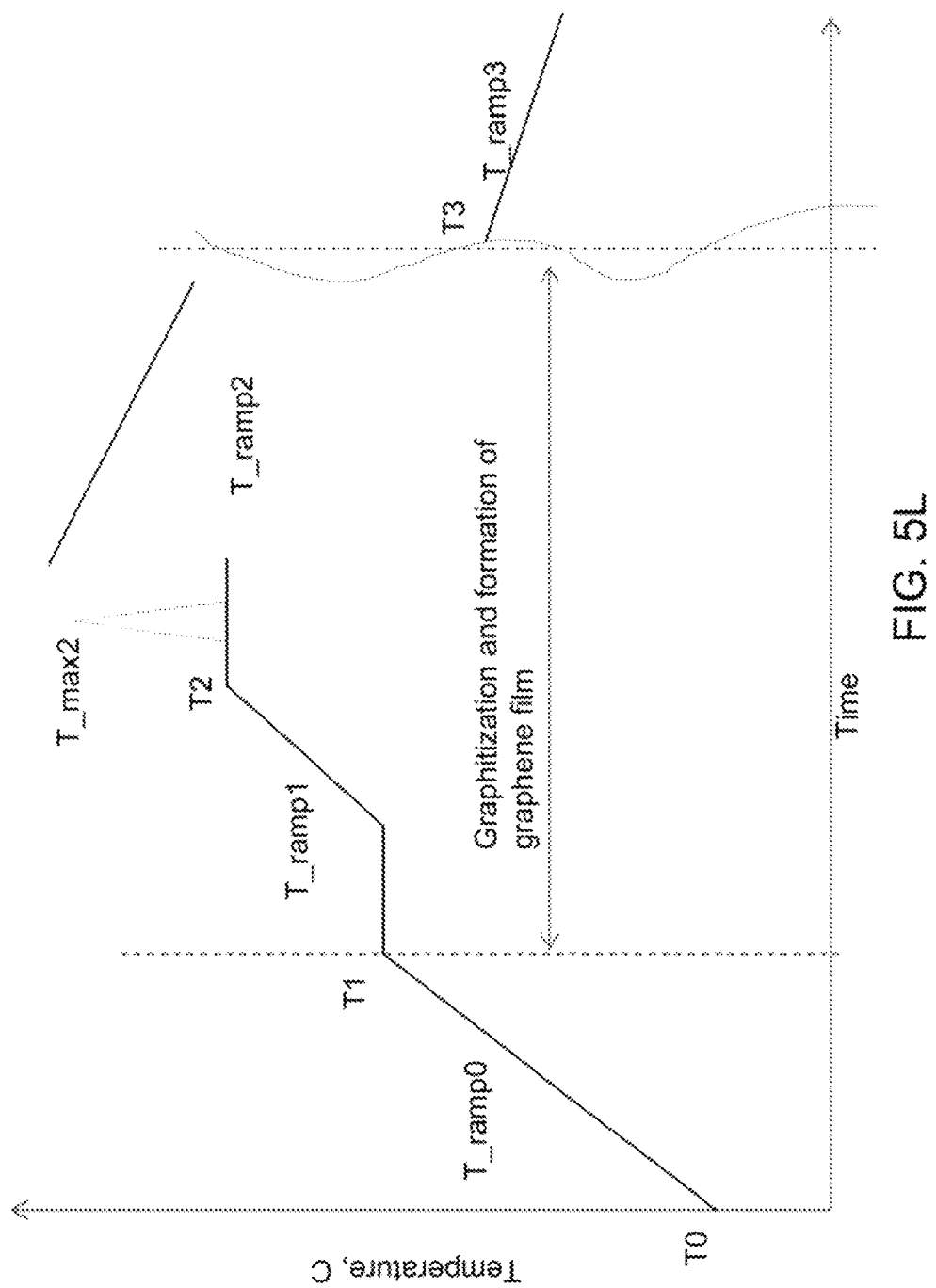
FIG. 5L illustrates an exemplary temperature cycle profile during a graphene formation process according to an embodiment of the present disclosure.

FIG. 5L illustrates an exemplary temperature cycle profile during the graphene formation process. In an illustrative example, the initial temperature T0 may be about 100 degrees Celsius, the initial ramp up rate T_ramp0 may be in a range from 10 degrees Celsius per minute to 20 degrees Celsius per minute, the carbon deposition temperature T1 may be about 700 degrees Celsius, the graphitization anneal ramp up rate T_ramp1 may be in a range from 10 degrees Celsius per minute to 40 degrees Celsius per minute, the graphitization anneal temperature T2 may be in a range from 900 degrees Celsius to 950 degrees Celsius, the graphitization anneal ramp down rate T_ramp2 may be in a range from 5 degrees Celsius per minute to 20 degrees Celsius per minute, and the terminal ramp down rate T_ramp3 may be in a range from 5 degrees Celsius per minute to 20 degrees Celsius per minute. It is understood that all processing parameters may be optimized to improve the quality of the at least one graphene layer 60. Optionally, rapid thermal anneal may be used to raise the temperature to a peak temperature in a range from 1,000 degrees Celsius to 1,100 degrees Celsius during the graphitization anneal step. Total time for the graphitization anneal step may be in a range from 1 minute to 20 minutes.

Referring back to the processing step labeled "4" in FIG. 5F and referring to FIG. 5G, each of the at least one graphene layer 60 includes a hexagonal lattice within a vertical plane that is parallel to an inner surface of the memory film 50. i.e., the inner sidewall of the tunneling dielectric layer 56. In one embodiment, each of the at least one graphene layer 60 may have a cylindrical shape that vertically extends through multiple sacrificial material layers 42 within the alternating stack (32, 42). In one embodiment, that at least one graphene layer 60 comprises a plurality of nested graphene layers. In one embodiment, a total number of graphene layers within the at least one graphene layer 60 may be in a range from 1 to 6.

In one embodiment, the at least one graphene layer 60 may be doped with a dopant selected from B, N, Na, and K. The dopant may be incorporated into the at least one graphene layer 60 by providing the dopant in-situ during the chemical vapor deposition of the carbon atoms, or may be provided into the at least one graphene layer 60 by angled ion implantation after the graphitization anneal process. Alternatively or additionally, plasma doping may be performed to introduce the dopant into the at least one graphene layer 60 while the polycrystalline metal layer 608 is present or after removal of the polycrystalline metal layer 608.

In one embodiment, the atomic percentage of the dopant within the at least one graphene layer 60 may be within a range from 0.01% to 10%, such as from 0.05% to 5% (i.e., from approximately $\sim 5 \times 10^{19}$ to $\sim 5 \times 10^{21}$ dopant atoms per $cm^{-3}$), although lesser and greater atomic percentages of the dopant and the respective doping concentrations may also be used.

A suitable level of doping in the at least one graphene layer 60 may provide a band gap of at least 0.7 eV, which may be, for example, in a range from 0.7 eV to 1.4 eV although the band gap may be lower or higher than these lower and upper values. A bottom end of the at least one graphene layer 60 may directly contact a doped semiconductor material, such as a pedestal channel portion 11 or the semiconductor material layer 10 in case the pedestal channel portion 11 is omitted. It is estimated that the at least one graphene layer 60 may provide electron mobility in a range from 5,000 $cm^2$/Vs to 100,000 $cm^2$/Vs, which corresponds to an improvement over the electron mobility provided by polysilicon by a factor in a range from 250 to 5,000. Further, the at least one graphene layer 60 provides a very small sub-threshold slope of about 80 mV/decade.

Referring to the processing step labeled "5" in FIG. 5F and referring to FIG. 5H, the polycrystalline metal layer 608 may be removed selective to the at least one graphene layer 60 by a wet etch process. The at least one top graphene layer 607 may be lifted off upon removal of the underlying polycrystalline metal layer 608. However, the at least one graphene layer 60 remains attached to the tunneling dielectric layer 56. The chemistry of the wet etch process may be selected such that the metallic material of the polycrystalline metal layer 608 is removed selective to the material of the tunneling dielectric layer 56. In case the tunneling dielectric layer 56 includes silicon oxide, a metal etch chemistry that is selective to silicon oxide may be used for the wet etch process. The at least one graphene layer 60 functions as a vertical semiconductor channel for the vertical stack of memory elements that are formed within each memory opening 49. Each graphene layer within the at least one graphene layer 60 includes a single sheet of graphene, which may be doped with dopants such as B, N, Na, and/or K to provide a band gap in a range from 0.7 eV to 1.4 eV.

Referring to FIG. 5I, an optional dielectric liner 621 may be formed on the inner surface of the at least one graphene layer 60 by a conformal deposition process such as low pressure chemical vapor deposition or atomic layer deposition. The dielectric liner 621 may include a dielectric metal oxide material or silicon oxynitride. The dielectric liner 621 may increase the mobility of charge carriers (electrons) in the at least one graphene layer 60 by passivating surface states of the at least one graphene layer 60.

A dielectric core layer 622L may be deposited in the memory cavity 49' to fill any remaining portion of the memory cavity 49' within each memory opening 49. The dielectric core layer 622L includes a dielectric material such as silicon oxide or organosilicate glass. The dielectric core layer 622L may be deposited by a conformal deposition method such as low pressure chemical vapor deposition (LPCVD), or by a self-planarizing deposition process such as spin coating. The dielectric core layer 622L may be deposited on the dielectric liner 621, or directly on the at least one graphene layer 60 in case the dielectric liner 621 is omitted.

Referring to FIG. 5J, horizontal portions of the dielectric core layer 622L, the dielectric liner 621, and the at least one graphene layer 60 overlying the top surface of the insulating cap layer 70 may be removed, for example, by a recess etch process. Further, the dielectric core layer 622L and the dielectric liner 621 may be further recessed below the horizontal plane including the top surface of the insulating cap layer 70 by the recess etch process. Recessed surfaces of the dielectric core layer 622L and the dielectric liner 621 may be formed between the horizontal plane including the top surface of the insulating cap layer 70 and the horizontal plane including the bottom surface of the insulating cap layer 70. Each remaining portion of the dielectric core layer 622L constitutes a dielectric core 622. Each combination of a dielectric core 622 and a dielectric liner 621 constitutes a dielectric core assembly 62.

Each dielectric core 622 may be formed directly on a dielectric liner 621. Each dielectric liner 621 laterally surrounds a respective dielectric core 622. The dielectric core 622 is formed over, and is laterally surrounded by, the at least one graphene layer 60 within each memory opening 49. A recess region is present above each dielectric core assembly 62.

Referring to FIG. 5K, a metallic drain region 63 may be formed directly on an upper end of the at least one graphene layer 60 by deposition and planarization of a metallic material. The metallic material may include Ni, Ti, Au, Pd, Cr, Pd, alloys thereof, and/or metal silicides thereof. The metallic material may be deposited in each recess region overlying the dielectric core assemblies 62. Excess portions of the metallic material may be removed from above the horizontal plane including the top surface of the insulating cap layer 70 by a planarization process such as a recess etch or chemical mechanical planarization. Each remaining portion of the metallic material constitutes a metallic drain region 63.

Each at least one graphene layer 60 constitutes a vertical semiconductor channel through which electrical current may flow when a vertical NAND device including the at least one graphene layer 60 is turned on. A tunneling dielectric layer 56 is surrounded by a charge storage layer 54, and laterally surrounds a portion of the at least one graphene layer 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and at least one graphene layer 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core assembly 62, and a metallic drain region 63 within a memory opening 49 is herein referred to as a memory opening fill structure 58. Each combination of a pedestal channel portion 11 (if present), a memory film 50, a at least one graphene layer 60, a dielectric core assembly 62, and a metallic drain region 63 within each support opening 19 fills the respective support openings 19, and constitutes a support pillar structure.

Figure 6:
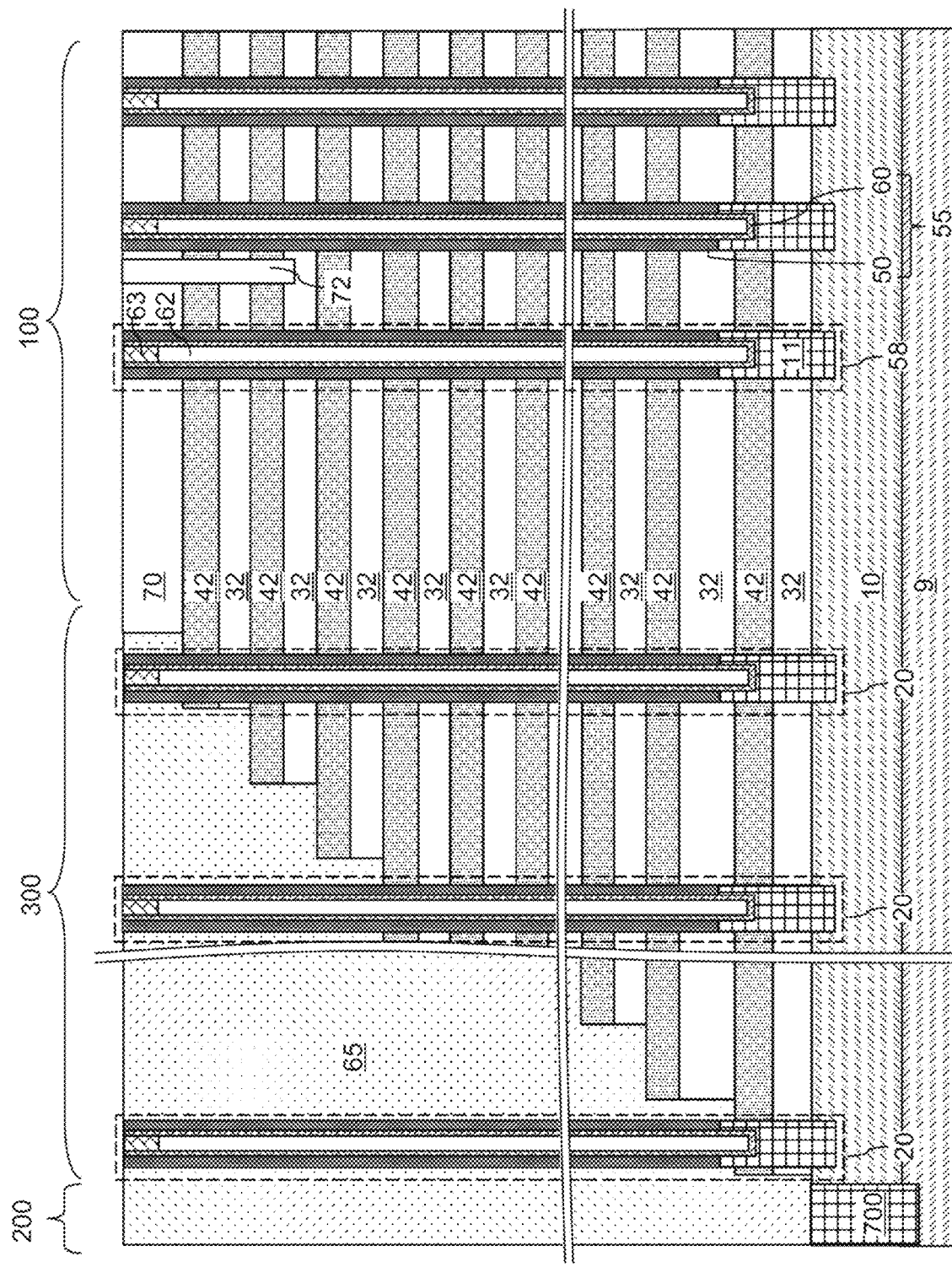
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes at least one graphene layer 60 and a memory film 50. The memory film 50 may comprise a tunneling dielectric layer 56 laterally surrounding the at least one graphene layer 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the at least one graphene layer 60.

Figure 7A:
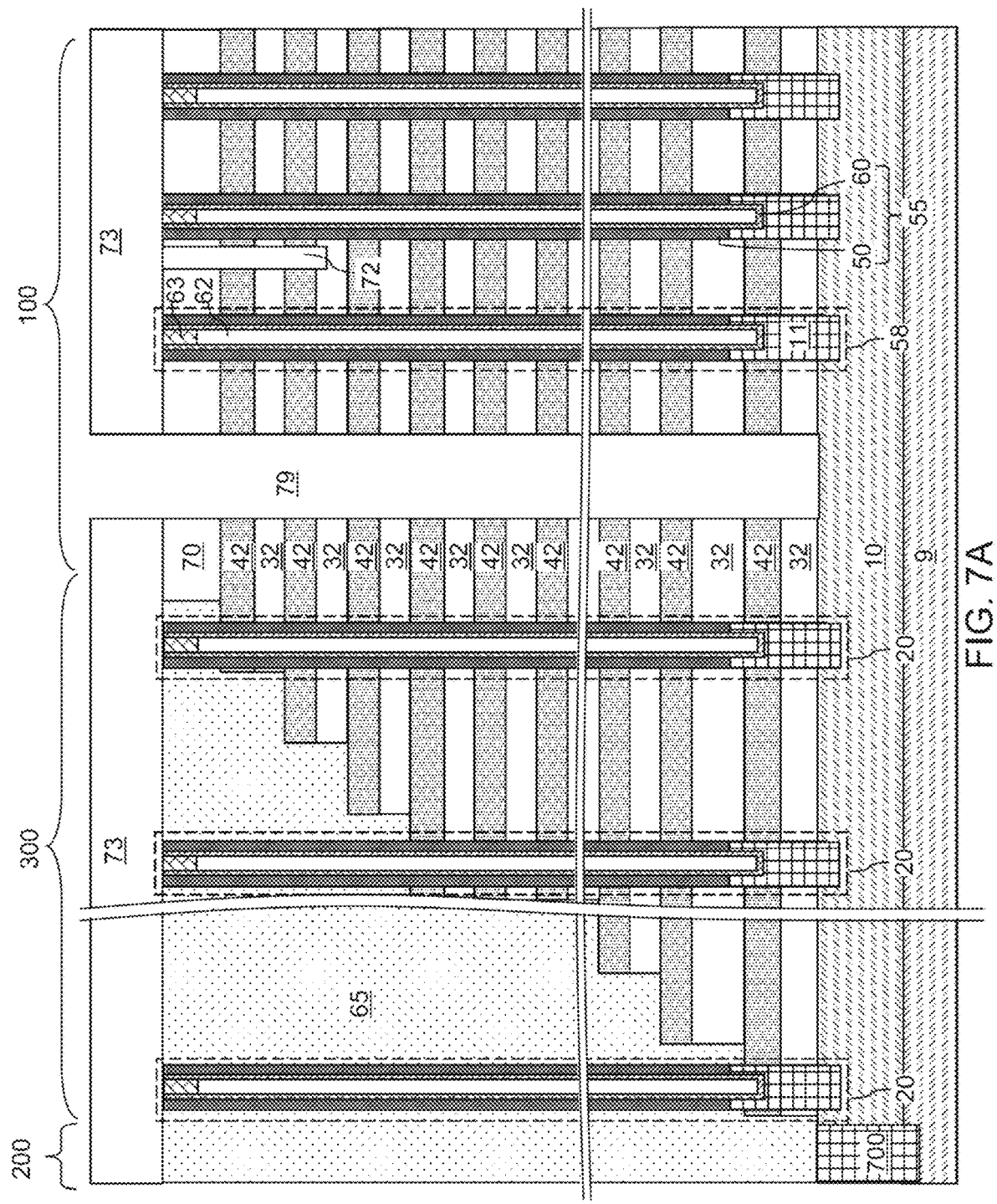
FIG. 7A is a schematic vertical cross-sectional view of the exemplary structure after formation of backside trenches according to an embodiment of the present disclosure.
Figure 7B:
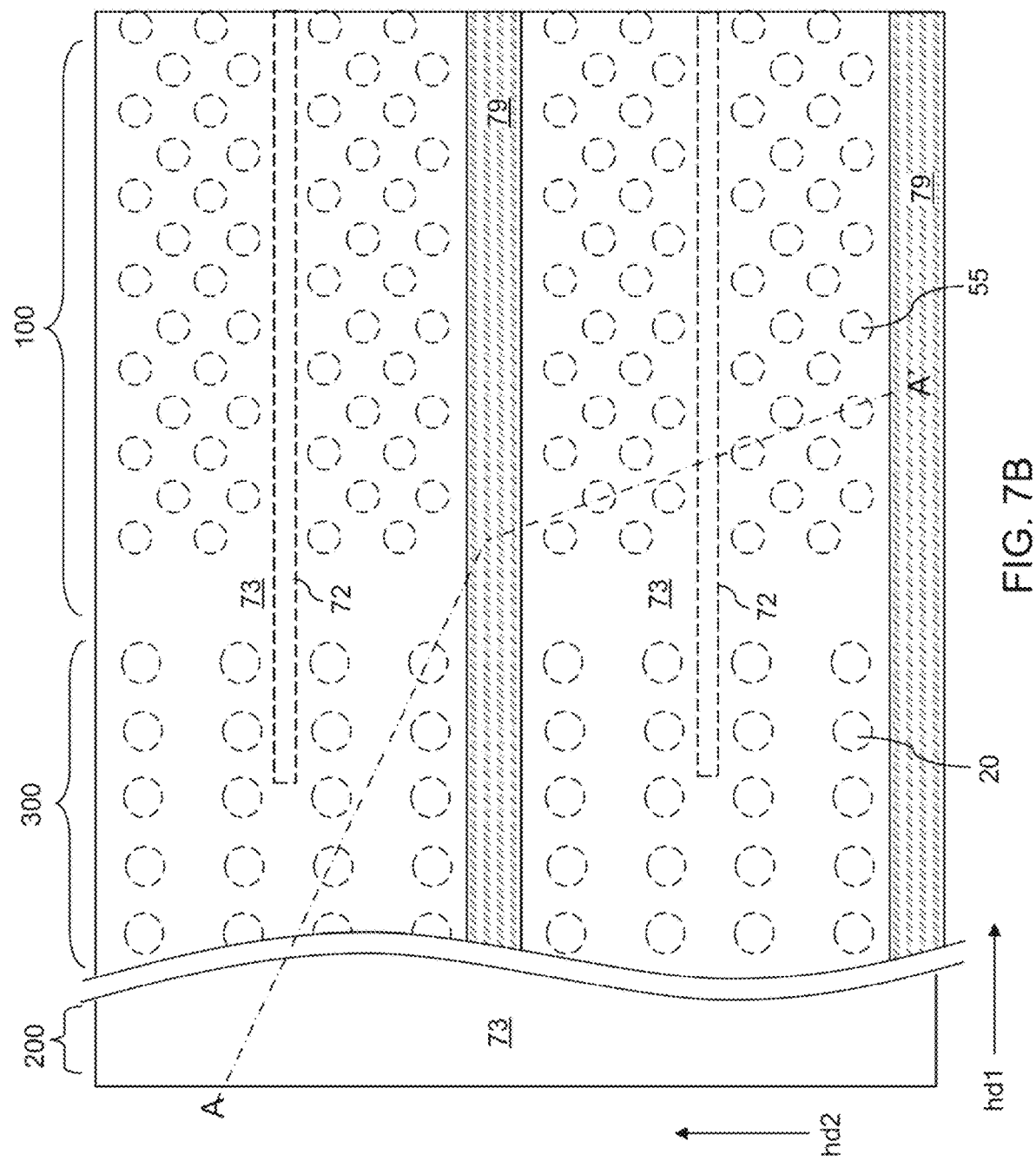
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 8:
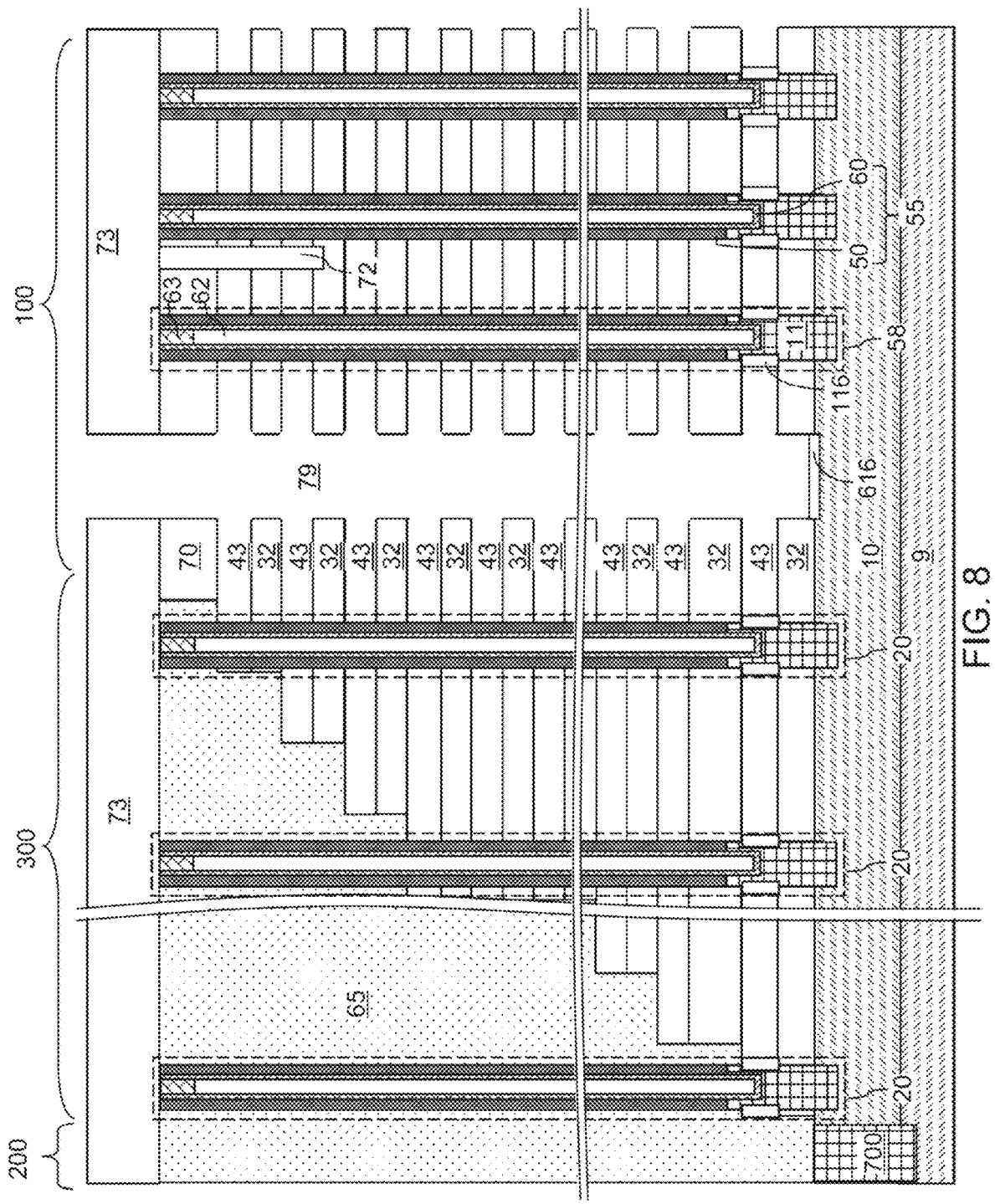
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 may be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 9B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside dielectric layer 44.

Figure 9D:
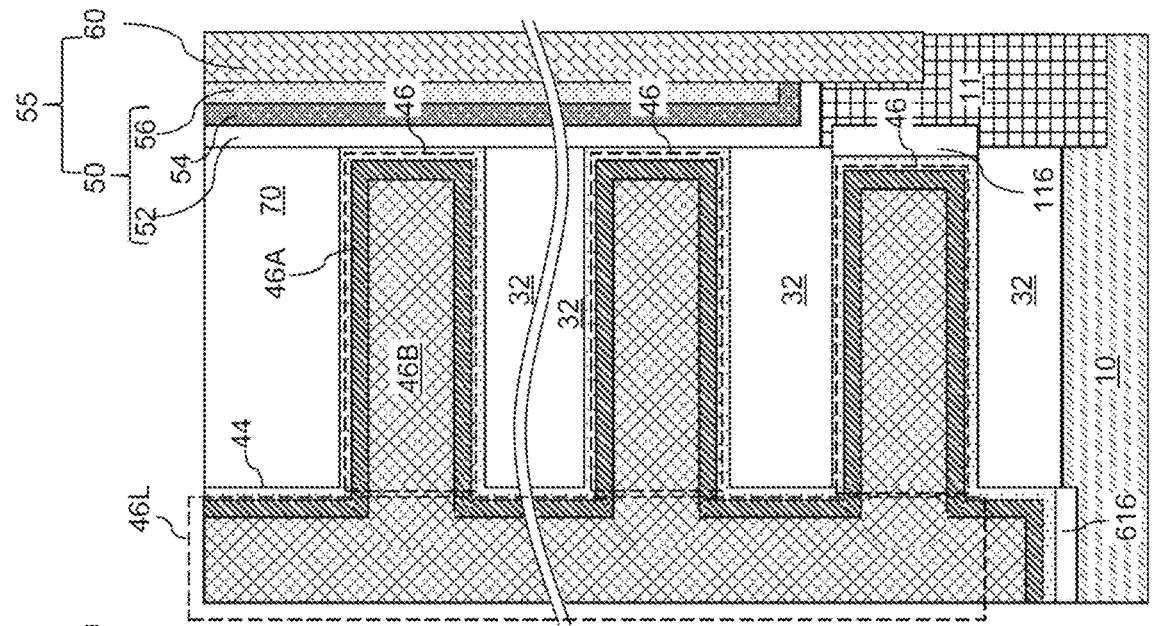
Figure 9C:
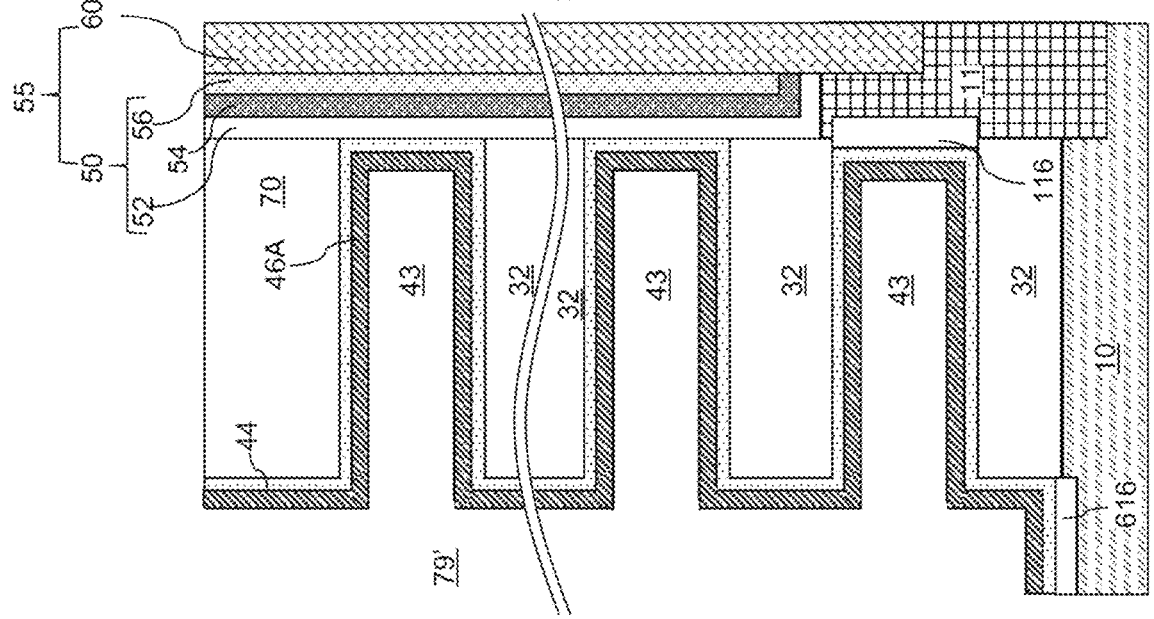

Referring to FIG. 9C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 10:
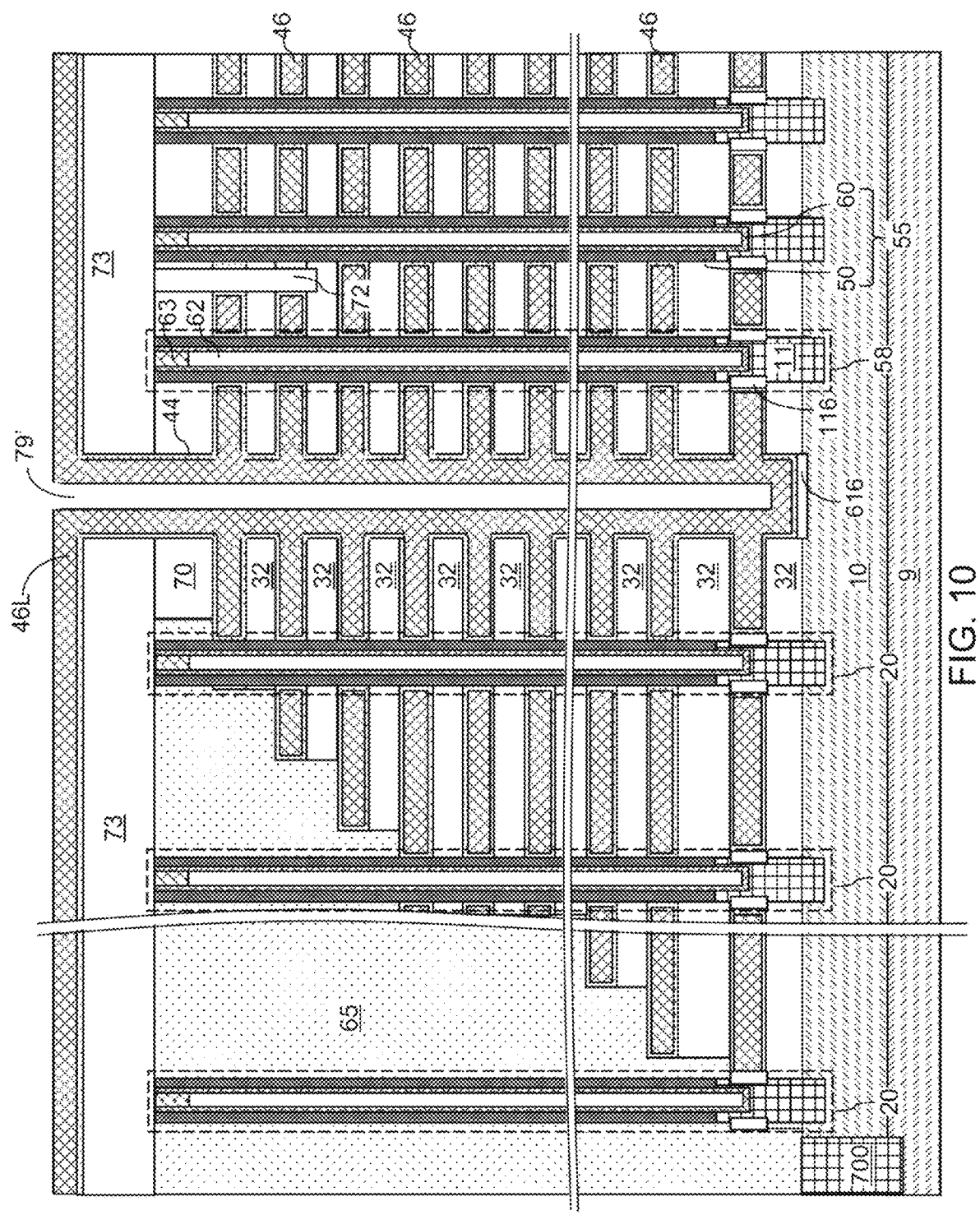
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
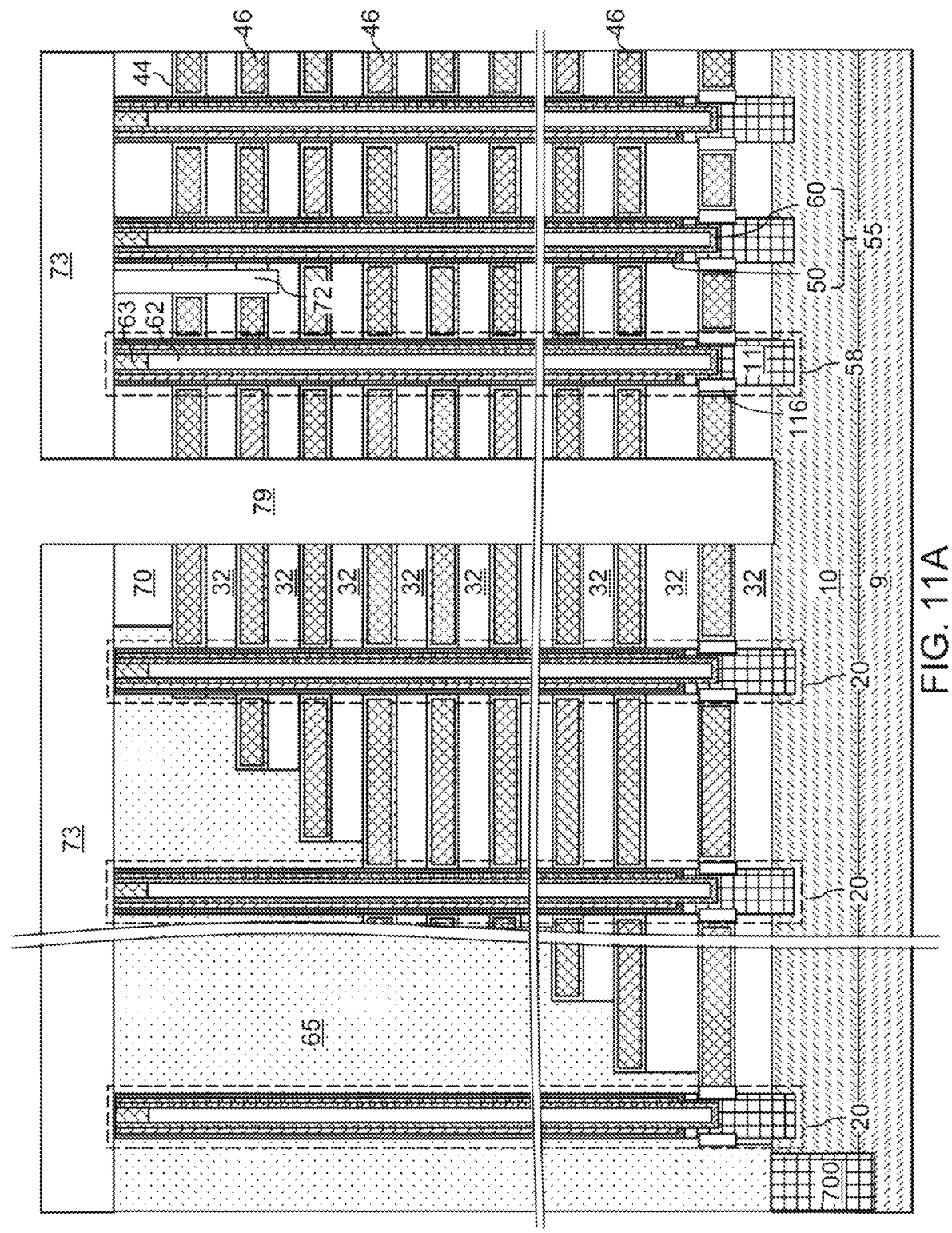
FIG. 11A is a schematic vertical cross-sectional view of the exemplary structure after removal of a deposited conductive material from within the backside trench according to an embodiment of the present disclosure.
Figure 11C:
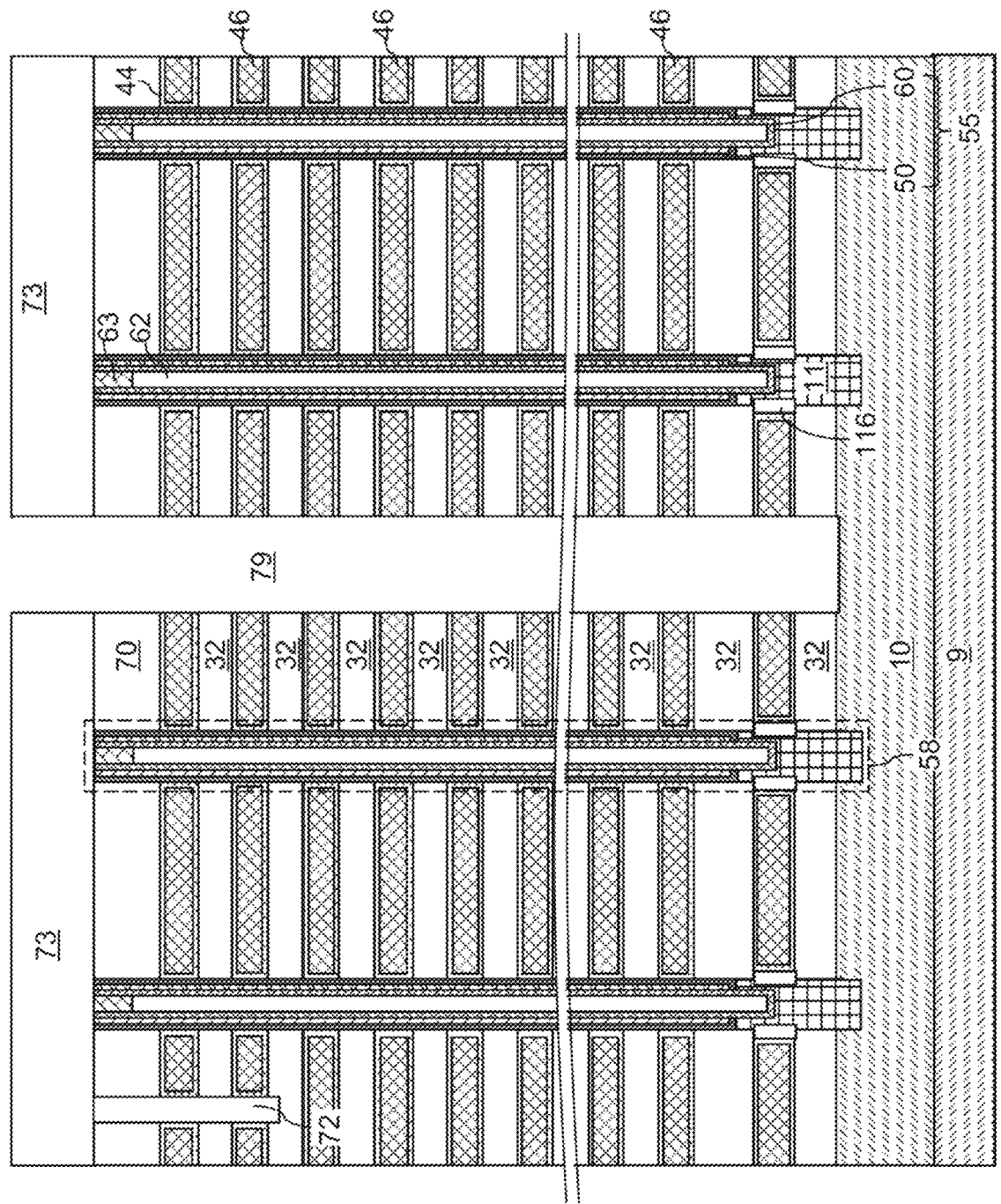
FIG. 11C is a vertical cross-sectional view of the exemplary structure along the vertical plane C-C' of FIG. 11B.

Referring to FIGS. 11A-11C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' is present within each backside trench 79.

Figure 12A:
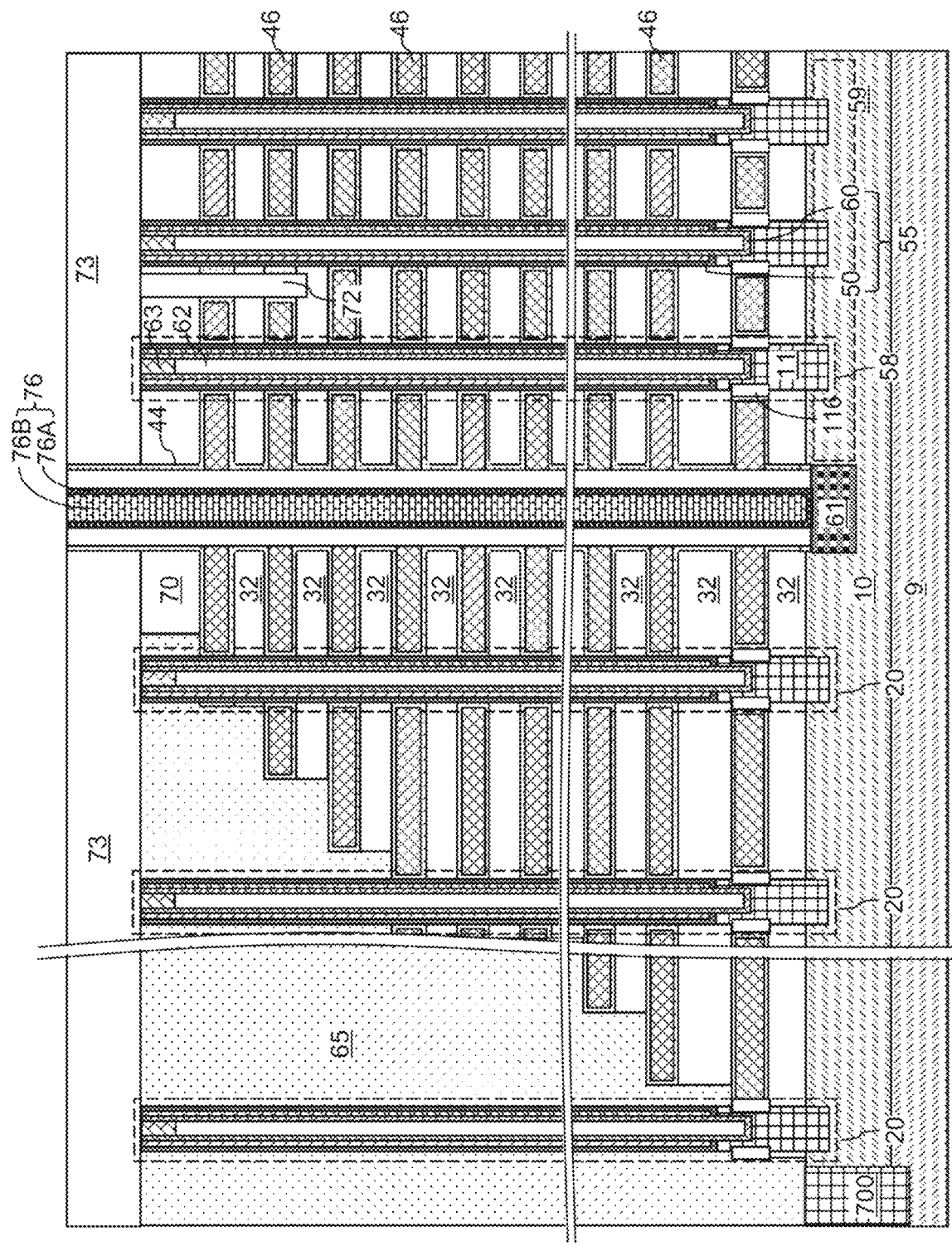
FIG. 12A is a schematic vertical cross-sectional view of the exemplary structure after formation of an insulating spacer and a backside contact structure according to an embodiment of the present disclosure.
Figure 12B:
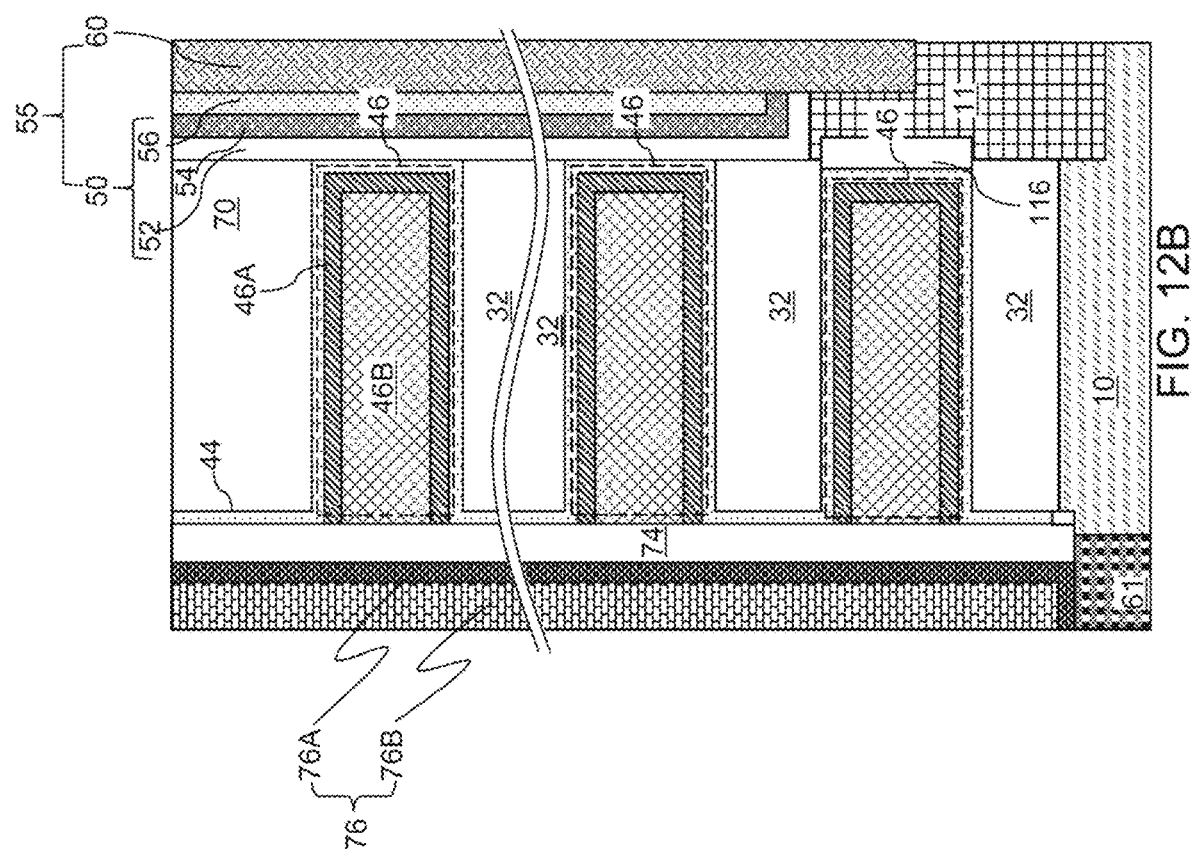
FIG. 12B is a magnified view of a region of the exemplary structure of FIG. 12A.

Referring to FIGS. 12A and 12B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels (each comprising at least one graphene layer 60) through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of metallic drain regions 63. The semiconductor channels (59, 11, 60) include the vertical semiconductor channels (each comprising at least one graphene layer 60) of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 13B:
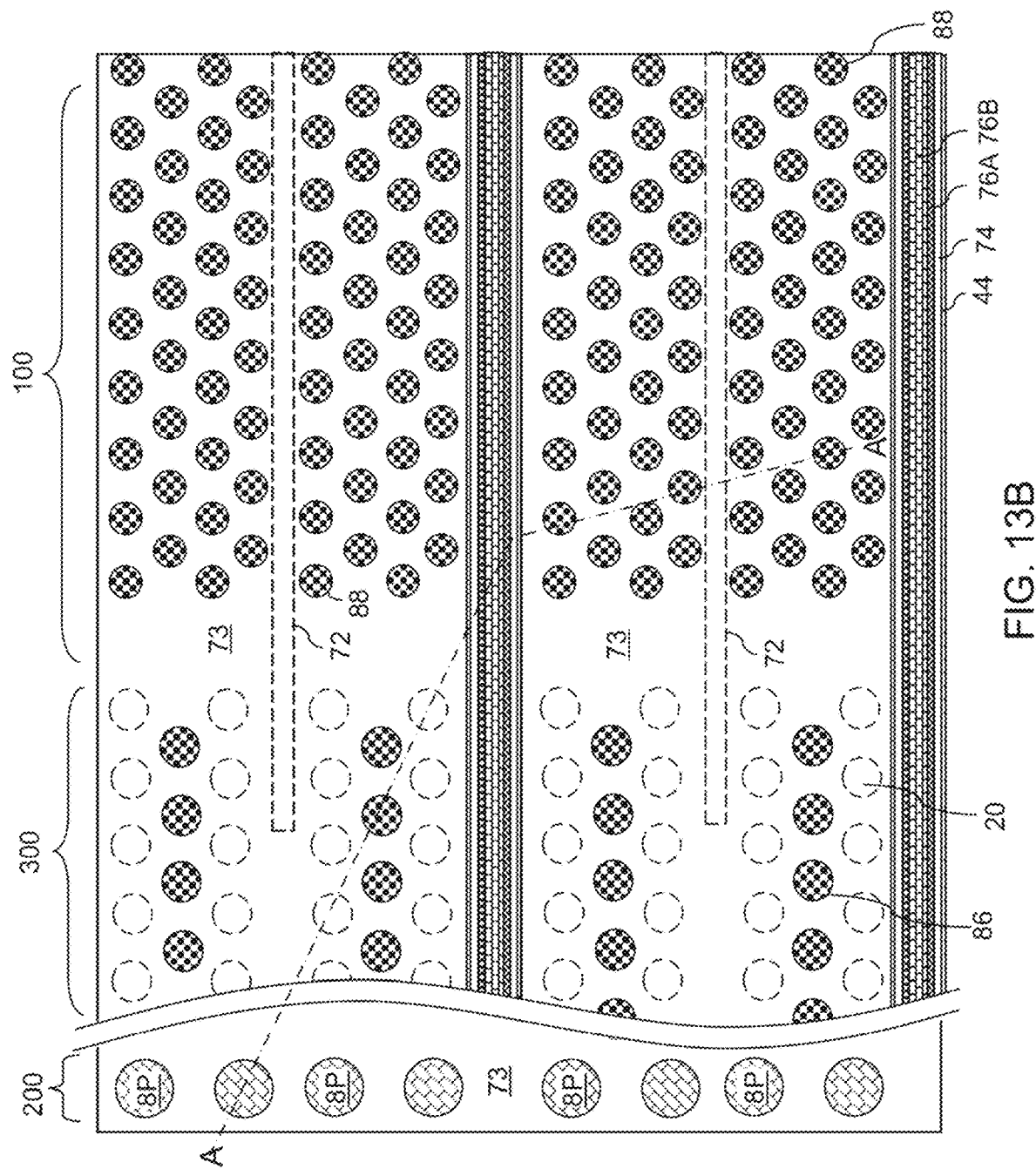
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each metallic drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices.

Referring to all drawings and according to various embodiments of the present disclosure, a three-dimensional memory device is provided, which comprises: an alternating stack of insulating layers 32 and electrically conductive layers 46 located over a substrate (9, 10); and a memory stack structure 55 extending through the alternating stack (32, 46) and comprising a memory film 50 and a vertical semiconductor channel, wherein the vertical semiconductor channel contacts an inner sidewall of the memory film and comprises, and/or consists of, at least one graphene layer 60.

In one embodiment, each of the at least one graphene layer 60 includes a hexagonal lattice within a vertical plane that is parallel to an inner surface of the memory film 50. In one embodiment, each of the at least one graphene layer 60 has a cylindrical shape that vertically extends through multiple electrically conductive layers 46 within the alternating stack (32, 46). In one embodiment, the at least one graphene layer 60 comprises a plurality of nested graphene layers.

In one embodiment, the three-dimensional memory device comprises a dielectric core 622 laterally surrounded by the at least one graphene layer 60. The total number of graphene layers within the at least one graphene layer 60 between the memory film 50 and the dielectric core 622 is in a range from 1 to 6, in one embodiment. A dielectric liner 621 may laterally surround the dielectric core 622, and may be laterally surrounded by the at least one graphene layer 60. The dielectric liner 621 may comprise a material selected from a dielectric metal oxide material and silicon oxynitride.

In one embodiment, the at least one graphene layer 60 is doped with a dopant selected from B, N, Na, and K. The atomic percentage of the dopant within the at least one graphene layer 60 may be within a range from 0.01% to 10%, such as from 0.05% to 5%.

In one embodiment, the three-dimensional memory device may comprise a metallic drain region 63 in contact with an upper end of the at least one graphene layer 60 and comprising a material selected from Ni, Ti, Au, Pd, Cr, Pd, alloys thereof, and metal silicides thereof. A bottom end of the at least one graphene layer 60 may be in contact with a doped semiconductor material.

In one embodiment, the memory film 50 comprises a layer stack including a charge storage layer 54 and a tunneling dielectric layer 56; and the at least one graphene layer 60 is in direct contact with the tunneling dielectric layer 56.

In one embodiment, the alternating stack (32, 46) comprises a terrace region in which each electrically conductive layer 46 other than a topmost electrically conductive layer 46 within the alternating stack (32, 46) laterally extends farther than an overlying electrically conductive layer 46 within the alternating stack (32, 46); the terrace region includes stepped surfaces of the alternating stack (32. 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuit comprising a driver circuit (comprising as a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion (comprising at least one graphene layer 60) of each of the plurality of semiconductor channels (59, 11, 60) extends substantially perpendicular to a top surface of the substrate (9, 10) and comprising a respective one of the vertical semiconductor channels (each comprising at least one graphene layer 60); and a plurality of charge storage elements (comprising portions of the memory films 50, i.e., portions of the charge storage layer 54). Each charge storage element may be located adjacent to a respective one of the plurality of semiconductor channels (59, 11, 60).

Various embodiments disclosed herein provide a 3D NAND device structure with graphene body, wherein the performance of the device is enhanced by high mobilities in the graphene material (5000-10000 cm$^2$/Vs), which may provide short transit time. Various embodiments provide a device that may provide operating speeds that may be limited by the capacitive charging speed of the gate stack, i.e., RC delay of word lines and bit lines. The speed may be enhanced by short transit times and high level of cell current. Without wishing to be bound by a particular theory, it is believed that one limiting feature in three-dimensional NAND memory device is the low cell current due to the low current mobility of the polysilicon channel material. The graphene channel is advantageous for a three-dimensional NAND memory device because it solves or reduces this problem and improves cell current. In contrast, two-dimensional NAND channels are formed from single crystalline silicon (e.g., a channel located in a single crystalline silicon wafer or in an epitaxial crystalline silicon layer on such wafer), which has a higher channel mobility than polysilicon. Thus, the small amount of stored electrons rather than channel mobility is believed to be the limiting factor in two dimensional NAND memory devices.

Furthermore, the polysilicon channel in the three-dimensional NAND memory device has a high variability with temperature during different program, read and erase operations. The graphene channel also solves or reduces this problem. In contrast, as noted above, two-dimensional NAND memory device channels are formed from single crystalline silicon, which does not have the same temperature variability. It should be noted that the variability of the polysilicon channel is not limited to temperature. Due to large number of defects, predominantly at grain boundaries, and random nature of distribution of the grain boundaries across a multitude of channels in a multitude of memory holes, there is a large variability of polysilicon channel electrical characteristics, and hence memory cell characteristics, within a die, wafer, etc.

In contrast, as noted above, two-dimensional NAND memory device channels are formed from single crystalline silicon, which has significantly less defects, hence much less variability within a die and wafer, at the same temperature. Without wishing to be bound by a particular theory, it is believed that a graphene channel will provide significantly less variability from all sources, hence much less variability in cell electrical characteristics, as compared to polysilicon channel in three-dimensional NAND.

Still further, the channel in three-dimensional NAND memory device is formed in small diameter memory opening. A certain thickness is desired for polysilicon channels for optimum performance. This requires the memory openings to have a larger than desired diameter. In contrast, graphene channels can be one to a few monolayers thick and thus have a much lower thickness. This allows scaling of memory opening size to smaller dimensions and providing more memory holes per unit area. In contrast, two dimensional NAND memory device channels are formed on a flat substrate and memory openings are not used for channel formation. Thus, in view of the above, the graphene channel provides several synergistic advantages in a three-dimensional NAND memory device which are not applicable to a two-dimensional NAND memory device.

In some embodiments doped graphene provides band gaps of more than 0.7 eV. Disclosed embodiments provide for structures where channel conduction may be high and bit line voltage may be low resulting in better performance and less power consumed by the device. Embodiments disclosed herein include ambipolar carrier conduction of graphene that results in an enlargement of memory window (AVM) due to an easy modulation of electron and hole concentration, e.g., by gate bias, to enhance program/erase speeds. Embodiments using graphene channels allow for metal drain electrodes and source electrodes if applicable. In some disclosed embodiments, the vertical scaling limits (thickness of word line) may be extended since short-channel-effects in single memory cell devices may be resolved due to ambipolar carrier conduction and absence of charge depletion in graphene. Various embodiments include high-k films at tunneling dielectric-graphene interface to improve the graphene interface. Other embodiments include ultra-thin graphene channels in order to offer better scaling potential for memory holes.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate; and
a memory stack structure extending through the alternating stack and comprising a memory film and a vertical semiconductor channel, wherein the vertical semiconductor channel contacts an inner sidewall of the memory film and comprises at least one graphene layer;
a metallic drain region having a cylindrical sidewall that contacts an upper end of an inner cylindrical sidewall of the at least one graphene layer and comprising a metallic material selected from Ni, Ti, Au, Pd, Cr, Pd, alloys thereof, or metal silicides thereof; and
a dielectric liner in direct contact with an inner sidewall of the at least one graphene layer and comprising a material selected from a dielectric metal oxide material or silicon oxynitride, wherein the dielectric liner is configured to increase mobility of charge carriers in the at least one graphene layer by passivating surface states of the at least one graphene layer.

2. The three-dimensional memory device of claim 1, wherein each of the at least one graphene layer includes a hexagonal lattice within a vertical plane that is parallel to an inner surface of the memory film.

3. The three-dimensional memory device of claim 2, wherein each of the at least one graphene layer has a cylindrical shape that vertically extends through multiple electrically conductive layers within the alternating stack.

4. The three-dimensional memory device of claim 3, wherein the at least one graphene layer comprises a plurality of nested graphene layers.

5. The three-dimensional memory device of claim 1, further comprising a dielectric core laterally surrounded by the at least one graphene layer.

6. The three-dimensional memory device of claim 5, wherein a total number of graphene layers within the at least one graphene layer between the memory film and the dielectric core is in a range from 1 to 6.

7. The three-dimensional memory device of claim 5, wherein the dielectric liner laterally surrounds the dielectric core and is laterally surrounded by the at least one graphene layer.

8. The three-dimensional memory device of claim 7, wherein the metallic material of the metallic drain region is in direct contact with a top surface of the dielectric liner.

9. The three-dimensional memory device of claim 7, wherein:
the dielectric liner comprises silicon oxynitride; and
the silicon oxynitride of the dielectric liner increases a mobility of charge carriers in the at least one graphene layer by passivating surface states of the at least one graphene layer.

10. The three-dimensional memory device of claim 5, wherein:
the metallic material of the metallic drain region is in direct contact with a top surface of the dielectric core; and
the dielectric core comprises silicon oxide or organosilicate glass.

11. The three-dimensional memory device of claim 1, wherein the at least one graphene layer is doped with a dopant selected from B, N, Na or K.

12. The three-dimensional memory device of claim 11, wherein an atomic percentage of the dopant within the at least one graphene layer is within a range from 0.05% to 5%.

13. The three-dimensional memory device of claim 1, wherein a bottom end of the at least one graphene layer is in contact with a doped semiconductor material.

14. The three-dimensional memory device of claim 1, wherein:
the memory film comprises a layer stack including a charge storage layer and a tunneling dielectric layer; and
the at least one graphene layer is in direct contact with the tunneling dielectric layer.

15. The three-dimensional memory device of claim 1, wherein:
the alternating stack comprises a terrace region in which each electrically conductive layer other than a topmost electrically conductive layer within the alternating stack laterally extends farther than an overlying electrically conductive layer within the alternating stack;
the terrace region includes stepped surfaces of the alternating stack that continuously extend from a bottommost layer within the alternating stack to a topmost layer within the alternating stack; and
support pillar structures extend through the stepped surfaces and through a retro-stepped dielectric material portion that overlies the stepped surfaces.

16. The three-dimensional memory device of claim 1, wherein an interface between the metallic drain region and the at least one graphene layer comprises a cylindrical vertical interface between carbon atoms of the at least one graphene layer and a metallic element of the metallic material of the metallic drain region.

17. The three-dimensional memory device of claim 1, wherein a top surface of the metallic drain region is located within a same first horizontal plane as a top surface of the at least one graphene layer.

18. The three-dimensional memory device of claim 17, wherein a top surface of the memory film is located within the first horizontal plane.

19. The three-dimensional memory device of claim 1, wherein the substrate comprises:
a semiconductor material layer having a doping of a first conductivity type; and
a source region having a doping of a second conductivity type that is an opposite of the first conductivity type.

20. The three-dimensional memory device of claim 19, further comprising a pedestal channel portion comprising a portion of a semiconductor material, having a doping of the first conductivity type, and in contact with a bottom end of the at least one graphene layer and a top surface of the semiconductor material layer.

* * * * *